United States Patent
Rossi et al.

(10) Patent No.: US 12,337,668 B2
(45) Date of Patent: *Jun. 24, 2025

(54) TONNEAU SYSTEM FOR USE WITH A PICKUP TRUCK

(71) Applicant: WORKSPORT LTD., Richmond Hill (CA)

(72) Inventors: Steven Rossi, Vaughan (CA); Jonathan Loudon, Toronto (CA)

(73) Assignee: WORKSPORT LTD., Richmond Hill (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/634,639

(22) Filed: Apr. 12, 2024

(65) Prior Publication Data

US 2024/0253435 A1    Aug. 1, 2024

Related U.S. Application Data

(60) Continuation of application No. 18/450,835, filed on Aug. 16, 2023, now Pat. No. 11,987,110, which is a continuation of application No. 18/095,419, filed on Jan. 10, 2023, now Pat. No. 11,780,305, which is a continuation of application No. 17/572,616, filed on Jan. 10, 2022, now Pat. No. 11,760,177, which is a continuation of application No. 16/826,939, filed on Mar. 23, 2020, now Pat. No. 11,220,164, which is a division of application No. 15/771,957, filed as application No. PCT/CA2016/051247 on Oct. 28, 2016, now Pat. No. 10,596,887.

(60) Provisional application No. 62/248,831, filed on Oct. 30, 2015.

(51) Int. Cl.
*B60J 7/14* (2006.01)
*B60P 7/02* (2006.01)

(52) U.S. Cl.
CPC ................. *B60J 7/141* (2013.01); *B60P 7/02* (2013.01)

(58) Field of Classification Search
CPC ........ B60J 7/14; B60J 7/14116; B60J 7/1607; B60J 7/198; B60P 7/02
USPC ............ 296/100.02, 100.06, 100.07, 100.09
See application file for complete search history.

(56) References Cited

U.S. PATENT DOCUMENTS

| | | |
|---|---|---|
| 7,884,569 B2 | 2/2011 | Ward |
| 8,120,308 B2 | 2/2012 | Ward |
| 9,815,358 B1 | 11/2017 | Quintus et al. |
| 10,286,763 B2 * | 5/2019 | Capiak ................... B60J 7/108 |

(Continued)

FOREIGN PATENT DOCUMENTS

WO    2013/080014 A2    6/2013

*Primary Examiner* — Jason S Daniels
(74) *Attorney, Agent, or Firm* — Honigman LLP; Eric J. Sosenko; Jonathan P. O'Brien

(57) ABSTRACT

A tonneau system for use with a pickup truck. The tonneau system includes a frame and a tonneau cover having a plurality of tonneau sections. The tonneau cover includes solar energy-receiving material secured to a top exposed surface of at least two of the tonneau sections, which are pivotally connected to each other. The solar energy-receiving material of one tonneau section is electrically coupled to the solar energy-receiving material of the other tonneau section. Optionally, the system may further include energy storage system electrically coupled to the solar energy-receiving material for storing and deploying power generated by the solar energy-receiving material.

19 Claims, 26 Drawing Sheets

(56) References Cited

U.S. PATENT DOCUMENTS

| | | |
|---|---|---|
| 11,230,335 B2 * | 1/2022 | Kobayashi ............. B62D 65/16 |
| 11,780,305 B2 * | 10/2023 | Rossi ....................... B60J 7/198 |
| | | 296/100.09 |
| 2010/0308617 A1 | 12/2010 | Golden |
| 2013/0328348 A1 | 12/2013 | Agnew |
| 2014/0152046 A1 | 6/2014 | Facchinello et al. |
| 2014/0312646 A1 | 10/2014 | Copp et al. |
| 2015/0251539 A1 | 9/2015 | Sura et al. |
| 2016/0114666 A1 | 4/2016 | Yu |
| 2017/0210214 A1 | 7/2017 | Weltikol et al. |
| 2017/0291478 A1 | 10/2017 | Hall |
| 2019/0351748 A1 * | 11/2019 | Ford .......................... B60J 7/20 |

* cited by examiner

TONNEAU SYSTEM FOR USE WITH A PICKUP TRUCK

CROSS REFERENCE TO RELATED APPLICATION

This application is a continuation of U.S. application Ser. No. 18/450,835, filed Aug. 16, 2023, which is a continuation of U.S. application Ser. No. 18/095,419, filed Jan. 10, 2023, now U.S. Pat. No. 11,780,305, which is a continuation of U.S. application Ser. No. 17/572,616, filed Jan. 10, 2022, now U.S. Pat. No. 11,760,177, which is a continuation of U.S. application Ser. No. 16/826,939, filed Mar. 23, 2020, now U.S. Pat. No. 11,220,164, which is a divisional of U.S. application Ser. No. 15/771,957, filed Apr. 27, 2018, now U.S. Pat. No. 10,596,887, which is a § 371 National Stage Application of International Application No. PCT/CA2016/051247, filed Oct. 28, 2016, which claims the benefit of U.S. Provisional Application No. 62/248,831, filed Oct. 30, 2015. The entire contents of each of above referenced applications is herein incorporated by reference.

TECHNICAL FIELD

The following relates generally to tonneau covers. In particular, the following relates to a tonneau system for use with a pickup truck.

SUMMARY

In one aspect of the invention, a tonneau system for use with a cargo box of a pickup truck is provided. The cargo box typically includes opposing first and second sidewalls and also includes a front sidewall extending between the first and second sidewalls at one end thereof and a rear sidewall extending between the first and second sidewalls at another end thereof. The tonneau system includes: a first side rail configured to be respectively mounted to the first sidewall of the cargo box; a second side rail configured to be respectively mounted to the second sidewall of the cargo box; a tonneau cover having at least two tonneau sections including a first tonneau section and a second tonneau section, the tonneau sections being moveable relative to one another between an unfolded state and a folded state, in the unfolded state the tonneau sections substantially covering the cargo box, in the folded state the tonneau sections being arranged in a stack with the tonneau sections arranged one atop another, the first tonneau section being the tonneau section located closest to the front sidewall of the cargo box in the unfolded state; and the stack of tonneau sections being pivotally connected to at least one of the first and second side rails by a pivot connection, the pivot connection including first and second portions being moveable between secure and release positions, in the secure position the stack being retainingly engaged with the first and second side rails, in the release position the stack being removably engaged with the first and second side rails whereby the stack is removable from the cargo box while the first and second side rails remain mounted therewith.

In another aspect, one of the first and second portions is mounted to the stack and the other of the first and second portions is mounted to the first side rail.

In a further aspect, one of the first and second portions is mounted to the first tonneau section of the stack and the other of the first and second portions is mounted to the first side rail.

In an additional aspect, the first portion is a pin and the second portion includes a pin slot, the pin being received in the pin slot.

In another aspect, the pin projects from a side of the first tonneau section that is located immediately adjacent to the first side rail when the tonneau cover is in the unfolded position.

In a further aspect, the first and second side rails each include a top side and a lateral side, the lateral sides of the first and second side rails being located generally opposite from one another when the first and second side rails are mounted to the first and second sidewalls of the cargo box, the top side of the first and second side rails facing out of the cargo box when the first and second side rails are mounted to the first and second sidewalls of the cargo box, the pin slot is provided in the first side rail and includes a top opening formed in the top side of the first side rail, the pin slot further including a channel extending from the top opening.

In an additional aspect, the channel is open on the lateral side of the first side rail.

In another aspect, at least a portion of the pin has a cross-section of a non-round shape presenting a different width in a direction of the top opening in each of the secure position and the release position, at least a portion of the top opening having a width corresponding to the width of the non-round shape in the release position whereby the pin in the release position can pass through the top opening and the stack of tonneau sections removed from the side rails.

In a further aspect, the width of the non-round shape in the release position is smaller than the width of the non-round shape in the secure position.

In an additional aspect, the non-round shape is provided as a protrusion of the pin.

In another aspect, the protrusion is on an end of the pin.

In a further aspect, the non-round shape is provided as a flat protrusion of the pin.

In an additional aspect, adjacent to the non-round shape the pin is provided with a cross-section having a round shape.

In another aspect, the non-round shape is provided as a protrusion of the pin.

In a further aspect, the channel extends along a length of the first side rail.

In an additional aspect, the pin is slidingly received within the channel.

In another aspect, the stack of tonneau sections is pivotally connected to each of the first and second side rails by a pivot connection.

In a further aspect, the secure position of the pivot connection, the first tonneau section is generally parallel to a plane defined by the first and second side rails.

In an additional aspect, in the secure position of the pivot connection, the first tonneau section is horizontal oriented.

In another aspect, in the release position of the pivot connection, the first tonneau section is generally perpendicular to a plane defined by the first and second side rails.

In a further aspect, in the release position of the pivot connection, the first tonneau section is vertically oriented.

In an additional aspect, the pivot connection is spaced apart from an end of the at least one of the first and second side rails.

In another aspect, the tonneau sections are one of rigid and flexible.

In a further aspect, the first side rail includes a locking bracket moveable along the first side rail between an open position and a locking position, in the locking position the locking bracket engaging one of the first and second portions.

In an additional aspect, the first portion is a pin and the second portion includes a pin slot, the pin being received in the pin slot and the locking bracket engaging the pin in the locking position.

In another aspect, the locking bracket includes a locking slot, the locking slot engaging the pin in the locking position.

In a further aspect, the locking bracket is biased between the open position and the locking position.

In an additional aspect, the locking bracket includes a protuberance and the first side rail includes at least two indentations, the locking bracket being secured in the open positon by the protuberance engaging one of the indentations and being secured in the locking position by the protuberance engaging the other of the indentations.

In a further aspect of the invention, a tonneau system for use with a pickup truck is provided, the tonneau system including: a tonneau cover, comprising: a plurality of rigid tonneau sections, the plurality having at least a first tonneau section and a second tonneau section; a first hinge system coupling the first tonneau section to the second tonneau section, enabling stacking and expanding of the first tonneau section relative to the second tonneau section; and a frame, comprising a first side rail securable to a first side of a cargo box of a pickup truck and a second side rail securable to a second side of the cargo box of the pickup truck, the frame being pivotally connected to the first tonneau section distal to the first hinge system; at least one latch releasably securing the tonneau cover to the first side rail and to the second side rail and, when released, enables the stacked tonneau sections to depend into the cargo box.

The tonneau system may further comprise at least a second hinge system coupling a third tonneau section to the second tonneau section along an edge of the second tonneau section spaced apart from the first hinge system.

The first hinge system may comprise a piano hinge. The second hinge system may comprise a pair of piano hinges coupling a spacer member between the second tonneau section and the third tonneau section.

The first side rail and the second side rail may each comprise a pin slot, and the first tonneau section may have a pair of pins projecting therefrom at each side thereof, the pins being received in the pin slots to provide the pivotal connection of the frame to the first tonneau section.

The pin slots may comprise a notched top opening and a generally rearward-sloping channel.

A cap may be removably securable to the pin slots to prevent the pair of pins from being removed from the pin slots.

The pins may each comprise a flat protrusion that cooperate with the pin slots to prevent removal of the first tonneau section from the side rails when the first tonneau section is in an extended position.

The flat protrusions may cooperate with the pin slots to permit removal of the first tonneau section from the side rails when the first tonneau section is in a vertical position.

The at least one latch may comprise a catch secured to the side rail and a latchbolt extending from the first tonneau section.

The latchbolt may be disposed upon a flange extending from a bottom surface of the first tonneau section.

The latchbolt may comprise an actuator causing movement of a cable coupled to the latchbolts, wherein actuating the actuator causes a release of the latchbolt from the catch to permit free pivotal movement of the tonneau system.

A tonneau section distal from the first tonneau section may have a pair of latches projecting therefrom at each side thereof, the latches being securable to the side rails to retain the tonneau system in an extended position.

The at least one latch may comprise a catch secured to the side rail and a latchbolt extending from the tonneau section.

The latchbolt may be disposed upon a flange extending from a bottom surface of the tonneau section.

The latchbolt may comprise an actuator causing movement of a cable coupled to the latchbolts, wherein actuating the actuator causes a release of the latchbolt from the catch to permit pivoting of the tonneau section.

The pivotal connection may permit pivoting the tonneau cover upwards or downwards relative to the frame when the tonneau cover is in a nested position.

The tonneau system may further comprise a pair of struts pivotally connected to the bottom surface of the first tonneau section, the struts coupleable to the side rails to maintain the stacked tonneau sections in a generally upright position above the cargo box.

The tonneau system may further comprise a dead panel in fixed relationship to the frame, the dead panel being pivotally coupled to the first tonneau section and having a cable-activated release mechanism to permit the first tonneau section to be selectively pivoted thereto.

At least one tonneau section may comprise a solar panel disposed on the top surface thereof, and the tonneau system couples the solar panel to a battery to store power generated therefrom.

Each tonneau section may be coupled by an electrical cabling system comprising a cable extending from a sheath, wherein the cable is decouplable to permit removal or replacement of the respective tonneau section.

Each tonneau section and spacers separating each tonneau section may comprise electrical contacts disposed along edges thereof to permit electrical coupling among the tonneau sections.

The electrical contacts may be spring-loaded pins.

The frame may comprise a utility track along the top surface of at least one of the first side rail and the second side rail thereof to permit an attachment to be secured thereto.

The frame may comprise a utility track along the inner side surface of at least one of the first side rail and the second side rail thereof to permit an attachment to be secured thereto.

The frame may comprise a first utility track along the top surface of at least one of the first side rail and the second side rail and a second utility track along the inner side surface of the at least one of the first side rail and the second side rail thereof, to permit an attachment to be secured simultaneously to the first utility track and the second utility track.

These and other aspects are contemplated and described herein. It will be appreciated that the foregoing summary sets out representative aspects of a tonneau system to assist skilled readers in understanding the following detailed description.

BRIEF DESCRIPTION OF THE DRAWINGS

A greater understanding of the embodiments will be had with reference to the Figures, in which:

FIG. 2b is a bottom perspective view of the tonneau cover and frame of FIG. 2a;

FIG. 3 shows a left side view of the tonneau cover 28 of FIG. 2a;

DETAILED DESCRIPTION

Figure 1:
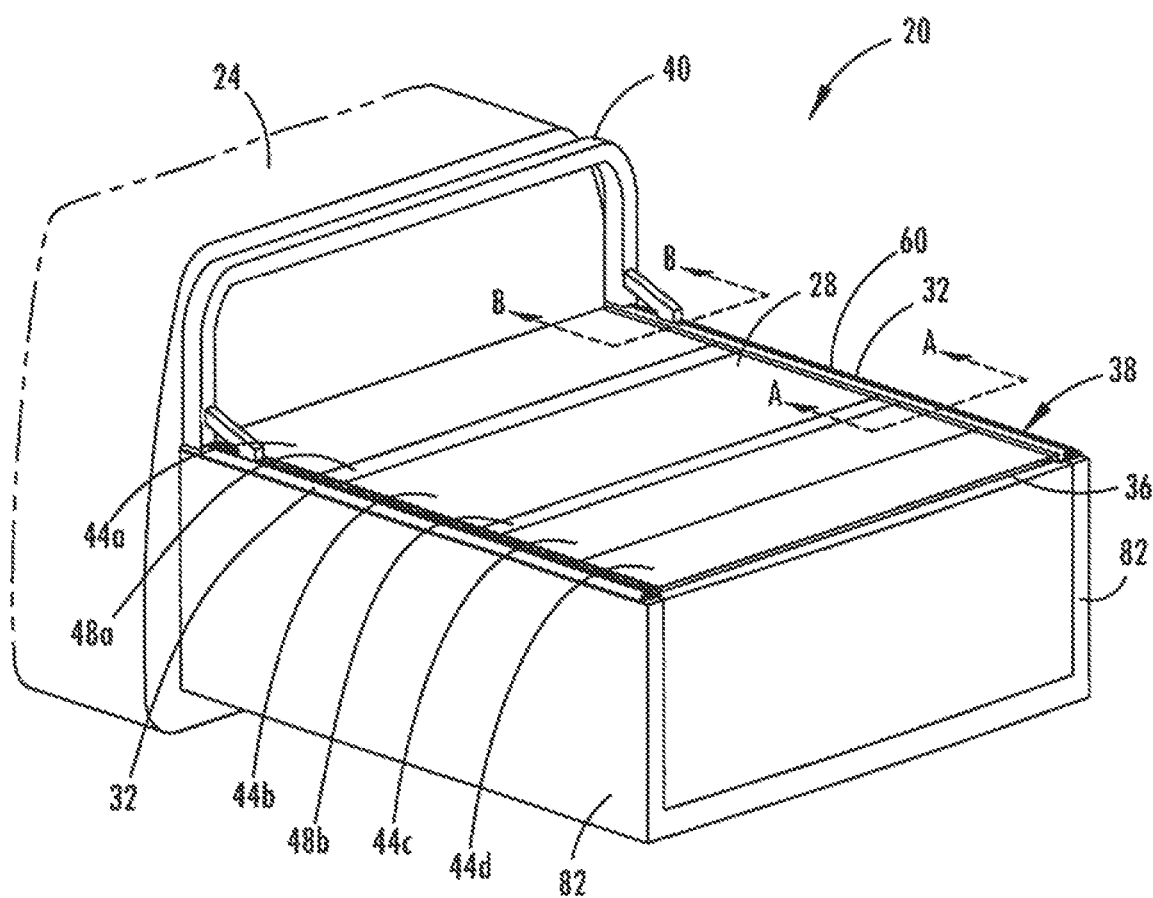
FIG. 1 is a side perspective view of a tonneau system for use with a pickup truck in accordance with one embodiment thereof.

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

The following provides a tonneau system for use with a pickup truck. The described tonneau system includes a tonneau cover, a frame, and at least one latch. The tonneau cover has a plurality of tonneau sections. The plurality of tonneau sections has at least a first tonneau section and a second tonneau section. In the following description, a third tonneau section is also included. In the following description, the section referred to as the first tonneau section is the one most closely abutting the truck cab.

A first hinge system couples the first tonneau section to the second tonneau section, enabling stacking and expanding of the first tonneau section relative to the second tonneau section. A second hinge system couples the second tonneau section to the third tonneau section, enabling stacking and expanding of the second tonneau section and third tonneau section, when stacked, relative to the first tonneau section. When installed on a pickup truck, the frame has a first side rail secured to a first side of a cargo box of a pickup truck and a second side rail secured to a second side of the cargo box of the pickup truck. The frame is pivotally connected to the first tonneau section distal to the first hinge system. The at least one latch releasably secures the tonneau cover to the first side rail and to the second side rail. When the at least one latch is released, the stacked tonneau sections are permitted to depend into the cargo box. In preferred embodiments, this prevents or mitigates blockage of the rearview window of the pickup cab.

An exemplary tonneau system 20 for use with a pickup truck 24 is shown in FIG. 1. The tonneau system 20 includes a tonneau cover 28 covering a cargo box of the pickup truck 24. The tonneau cover 28 is secured in an unfolded (expanded) state to a frame that includes two side rails 32 that are secured to the side walls of the cargo box. A back edge 36 of the tonneau cover 28 lies adjacent a tail gate of the cargo box. A utility rack 40 is optionally secured to front end of each of the side rails 32 for securing large apparatus such as ladders thereto.

Figure 2A:
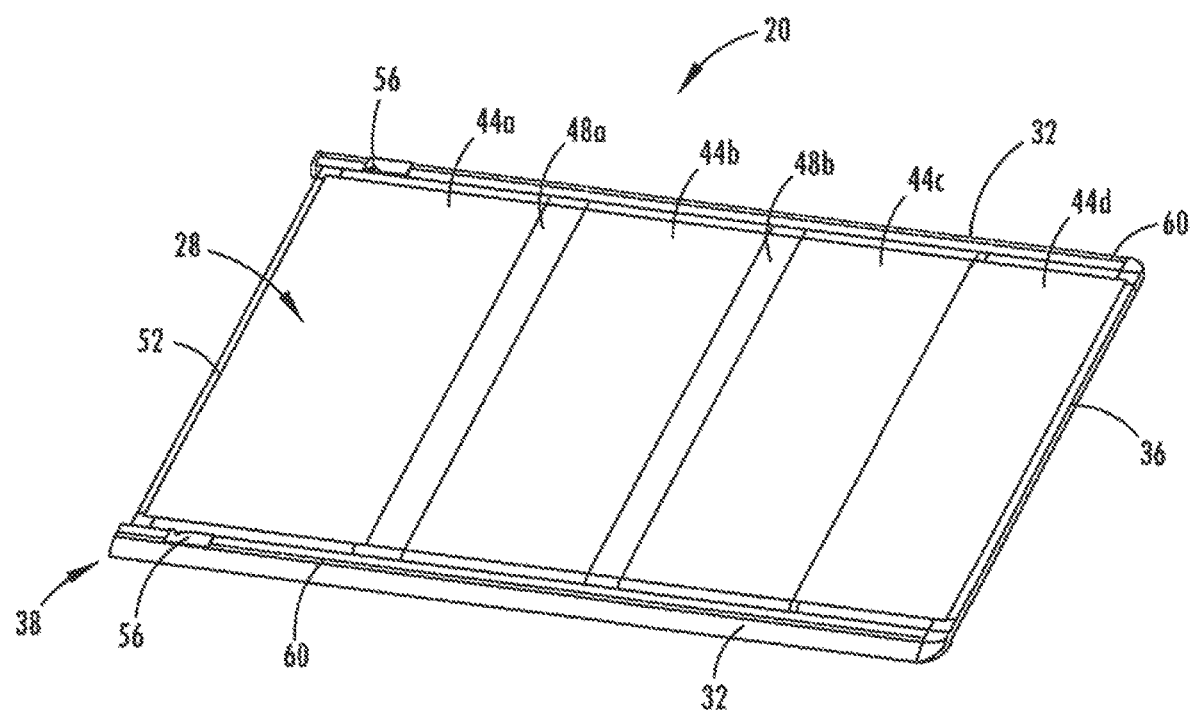
FIG. 2a is a top perspective view of the tonneau cover and frame of the tonneau system of FIG. 1.
Figure 2B:
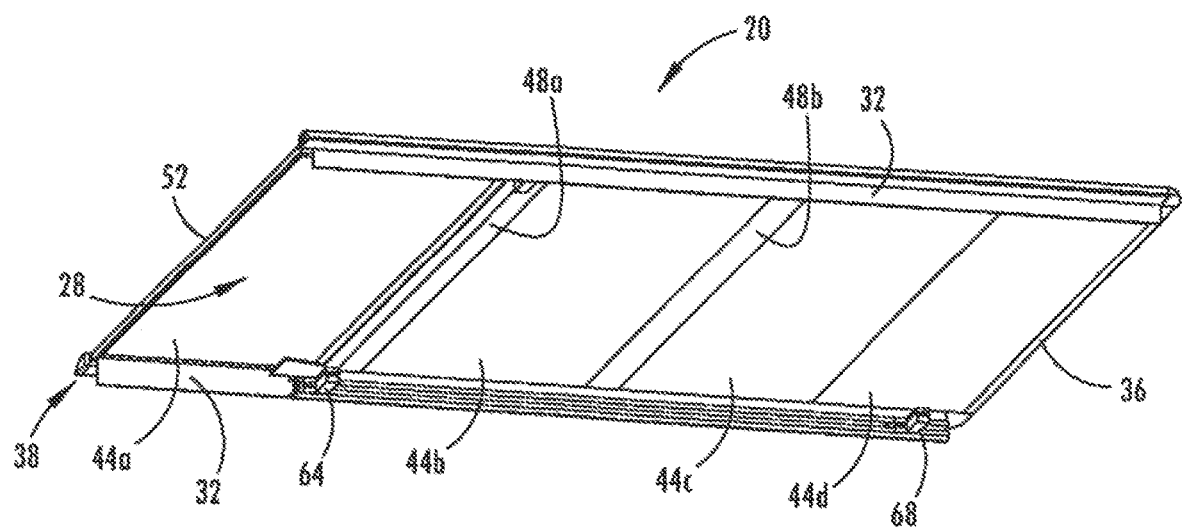
Figure 3:
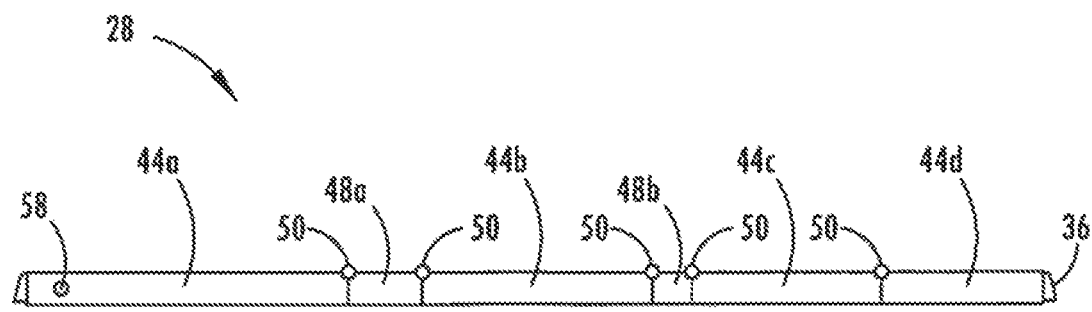

FIGS. 2a, 2b, and 3 show the tonneau cover 28 and frame 38 of the tonneau system 20 in more detail. The tonneau cover 28 can have a plurality of sections, but in the illustrated example, has four tonneau sections 44a, 44b, 44c, and 44d. The number of sections can be determined by designing the sections so that they are no longer than the height of the truck bed for reasons that will become apparent. It is possible that the sections can be slightly longer than such height depending on the location of a hinge member on the section closest to the truck cab, again for reasons that will become apparent.

Figure 12:
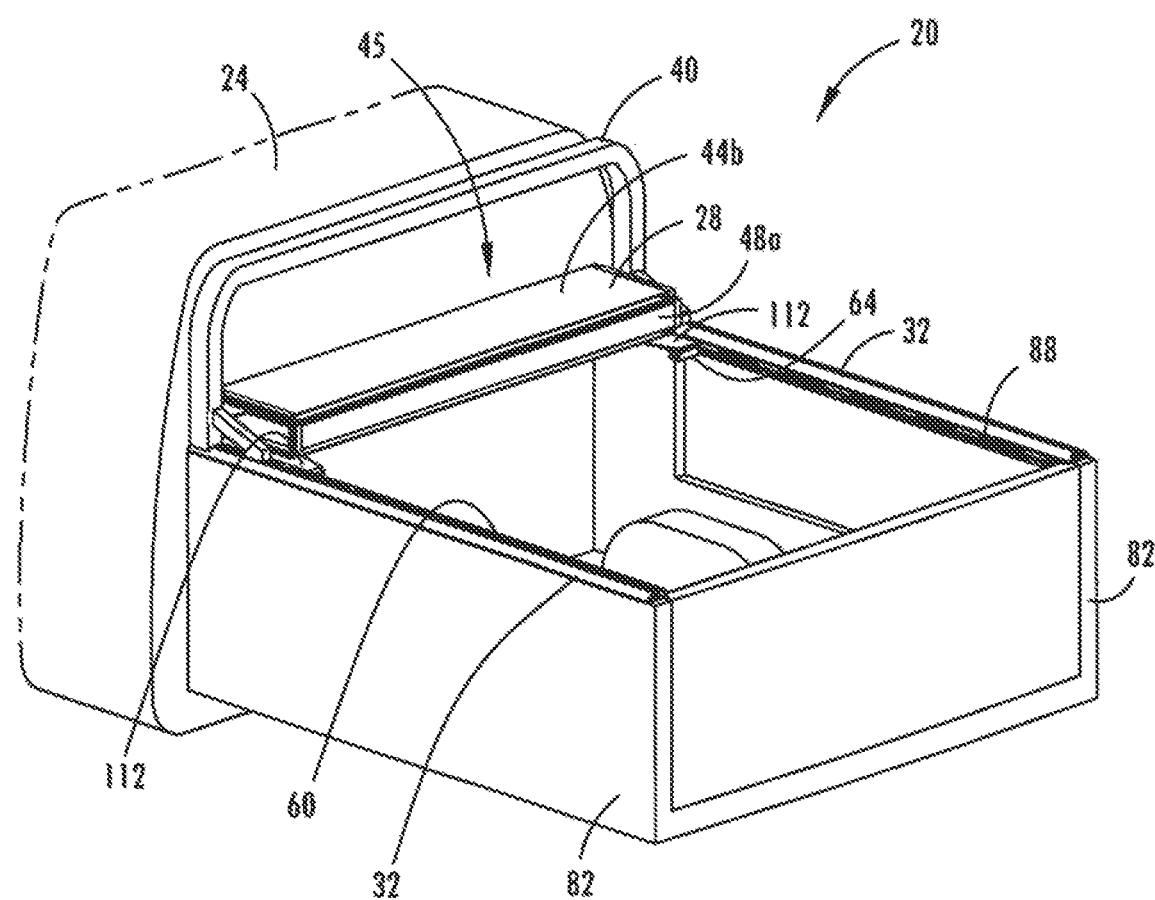
FIG. 12 shows the tonneau cover in a stacked state after engagement of the latch as shown in FIG. 11.

The tonneau sections 44a, 44b, 44c, and 44d have hinge systems there between to pivotally couple them. The hinge systems in this embodiment are piano hinges and spacer members used to enable nested stacking of the tonneau sections 44a, 44b, 44c, and 44d one atop another forming a stack 45 as seen in FIG. 12. In particular, a first spacer member 48a pivotally couples the tonneau section 44a that is closest to the front of the cargo box when deployed and the adjacent tonneau section 44b via piano hinges 50. A second spacer member 48b pivotally couples the tonneau section 44b to the adjacent tonneau section 44c via piano hinges 50. The tonneau section 44c is pivotally coupled to the rear-most tonneau section 44d via piano hinge 50.

In the embodiment shown, the tonneau sections 44a, 44b, 44c, and 44d and the spacer members 48a and 48b are constructed from aluminum panels housing a honeycomb structure therein to provide rigidity. Rubber or other suitable wipers, gaskets or sealing mechanisms (not shown) may be provided in between the tonneau sections and spacer members to prevent liquid ingress to the truck bed. Similarly, suitable wipers, gaskets or sealing mechanisms 96 may be provided between the frame side rails 32 and the tonneau cover 28 to prevent liquid ingress.

The frame 38 includes a front cross member 52 spanning the two side rails 32 at a front end thereof. The front end is adjacent the truck cab when the tonneau system is placed upon a truck bed.

A pin slot 56 is located along each side rail 32 for receiving a pin 58 projecting from each side of the tonneau section 44a distal from the first spacer member 48a.

A utility track 60 is located along the top of each side rail 32. The utility track 60 enables various attachments to be secured to the side rail 32 for securing tools, tool boxes, and the like thereto. The utility track 60 may be vented by one or more apertures along a rear and/or bottom surface thereof to permit water to drain from the utility track 60.

A pair of front latches 64 secures the tonneau section 44a at a rear end thereof to the side rails 32 to retain the first tonneau section in an extended position. A pair of rear latches 68 secures the tonneau section 44d at a rear end thereof to the side rails 32 to retain the tonneau cover as a whole in an extended position.

Figure 28:
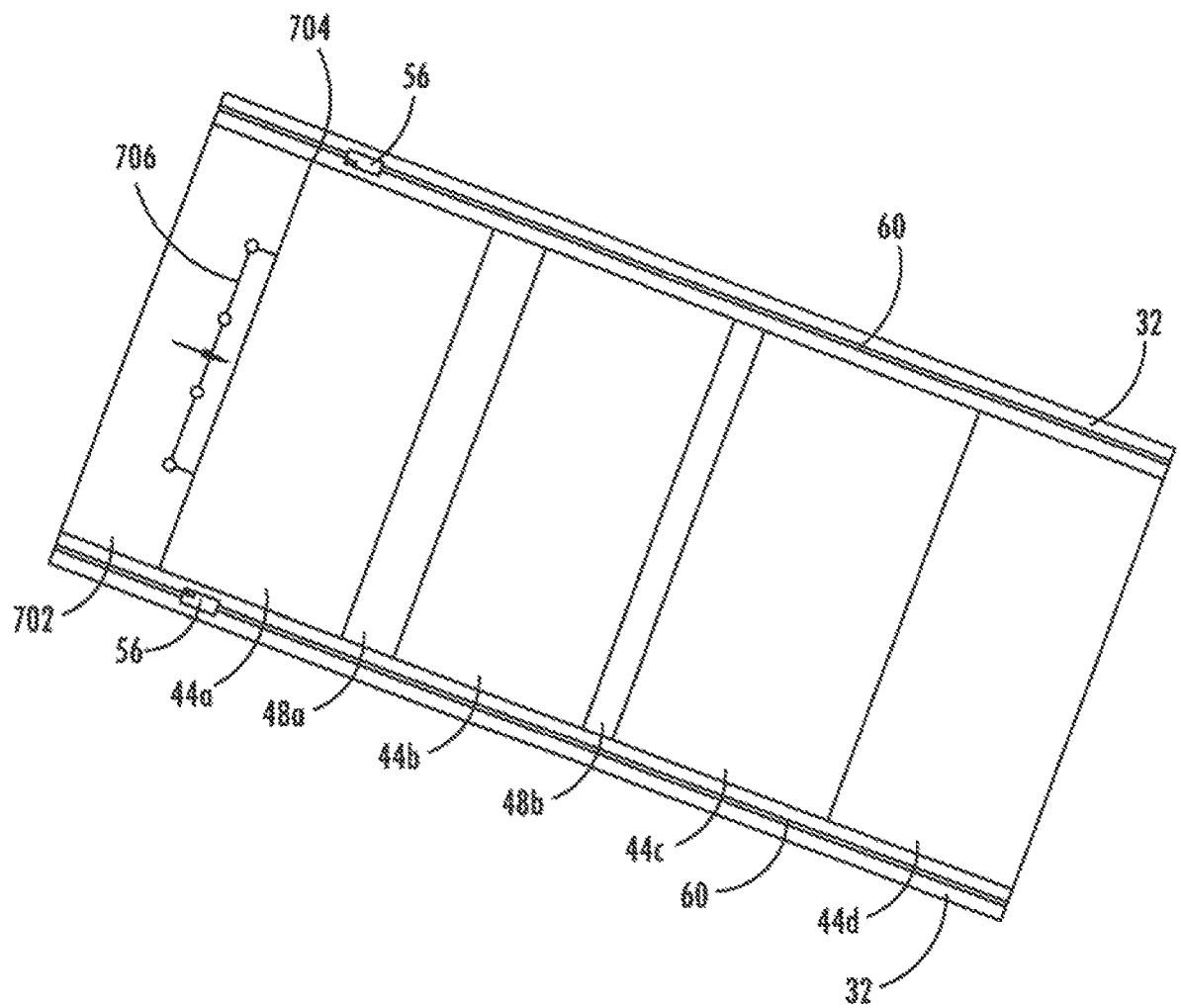
FIG. 28 shows a bottom view of an alternative tonneau cover arrangement in which a dead panel is provided ahead of the first tonneau section.

An alternative embodiment is shown in FIG. 28, in which a dead panel 702 is provided ahead of the first tonneau section 44a. In this case, a hinge 704 couples the dead panel 702 to the first tonneau section 44a so that the first tonneau section 44a can be pivoted into the bed during use. The dead panel is fixed in orientation to the frame, for example being integrated therein or fastened thereto.

Figure 4:
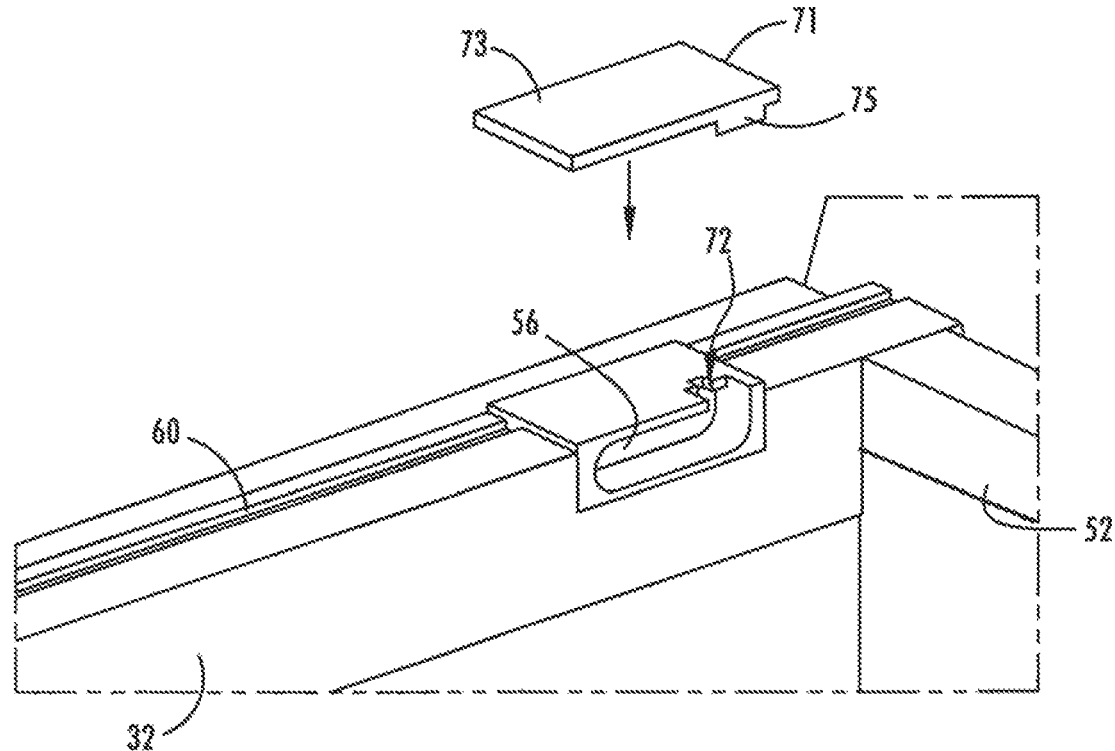
FIG. 4 shows a portion of a side railing of the frame of FIG. 1 having a slot for receiving the tonneau cover.

FIG. 4 shows the pin slot 56 of the left side rail 32 having a notched top opening 72 and a generally rearward-sloping channel. The right side rail 32 has a corresponding pin slot 56 with a similar notched top opening 72 and a generally rearward-sloping channel.

Figure 5:
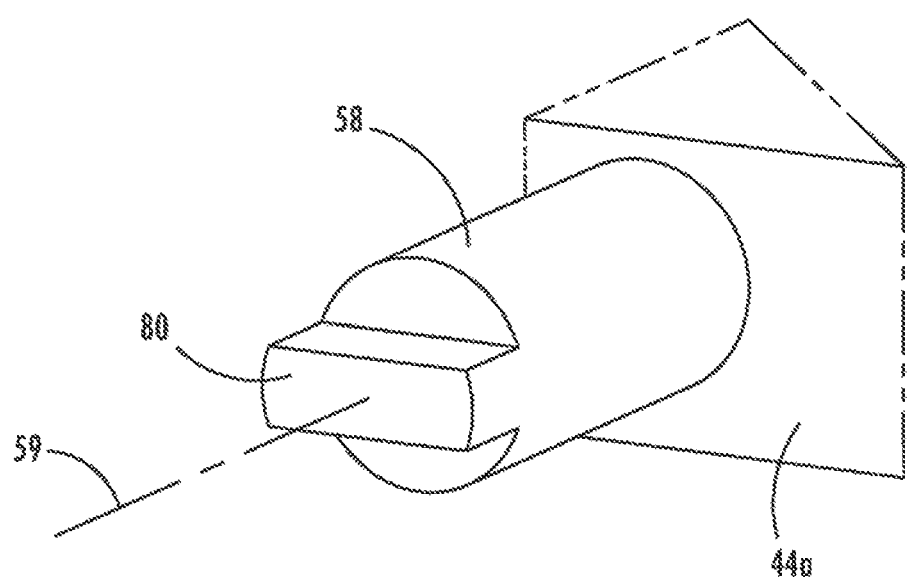
FIG. 5 shows a portion of a pivot pin of the tonneau cover of FIG. 1 to be received by the slot of FIG. 4.

FIG. 5 shows a pin 58 located on a left side of the tonneau section 44a that is received by the pin slot 56 of FIG. 4. The pin 58 has a flat protrusion 80. A cap 71 may be removably engaged to the top of the notched top opening 72 to retain the pin 58 in the slot 56 for further securing the pin from sliding out of the side rail 32 during operation. The cap 71 is a thin plate 73 that has a protrusion 75, allowing it to slide over the side opening of the notched top opening 72, preventing the tonneau cover's pin 58 from sliding out of the rail 32 during operation.

In another embodiment, the protrusion 80 of the pin 58 may be round to permit easier removal of the pin 58 from the slot 56. It will be appreciated that it is possible to remove the tonneau cover 28 altogether and utilize the frame with the pin slot 56 to engage a third party cover for the truck bed. For example, a soft cover or other device could be adapted to fit the frame.

Figure 6:
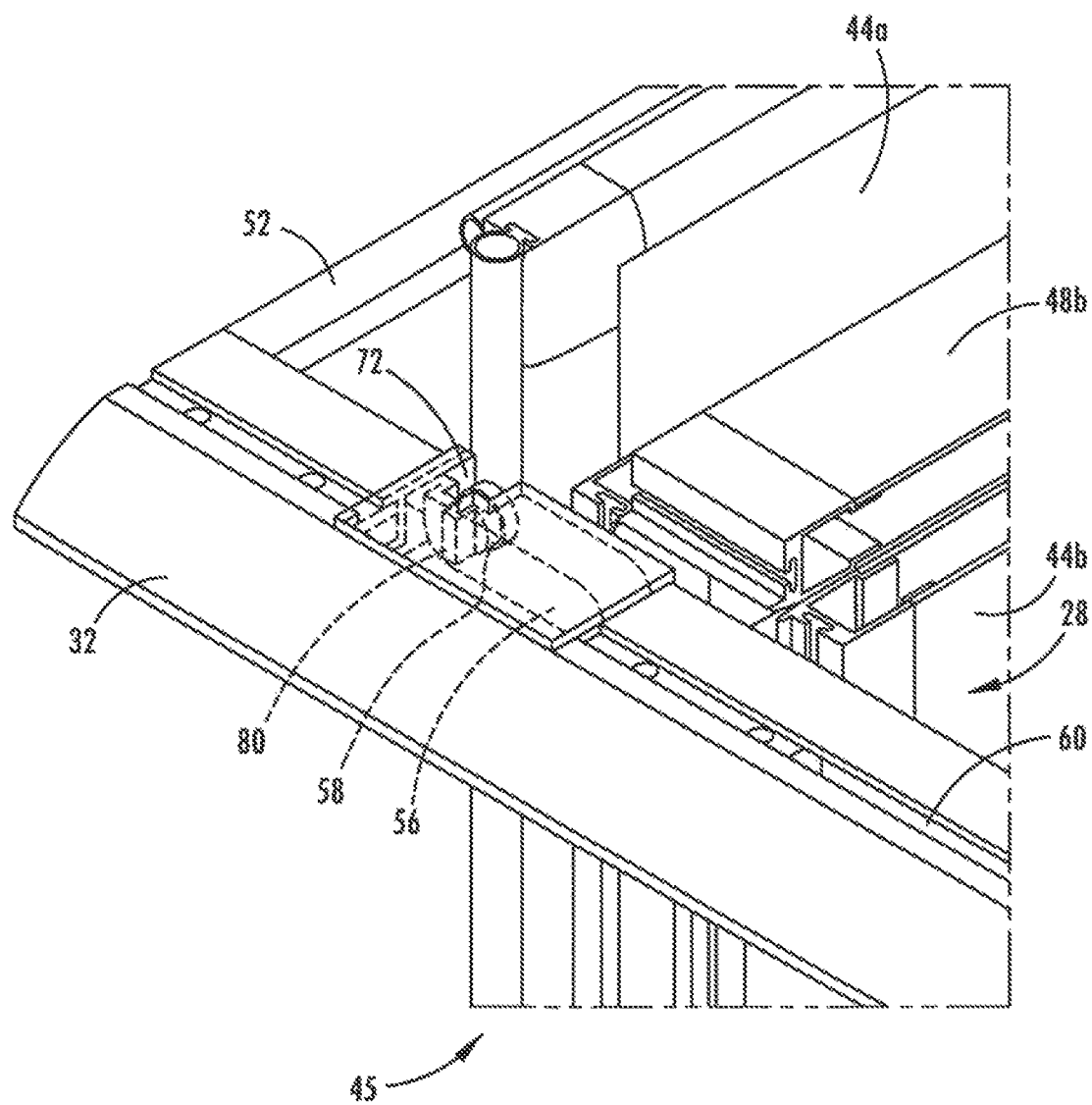
FIG. 6 shows the slot of a side rail of FIG. 4 having received the pivot pin of FIG. 5 of the tonneau cover in a stacked state.

As shown in FIG. 6, when the tonneau section 44a and pin 58 are oriented vertically, the flat protrusion 80 of the pin 58 is received by the notched top opening 72 of the slot 58 to allow the pin 58 to enter the channel of the pin slot 56.

Figure 7:
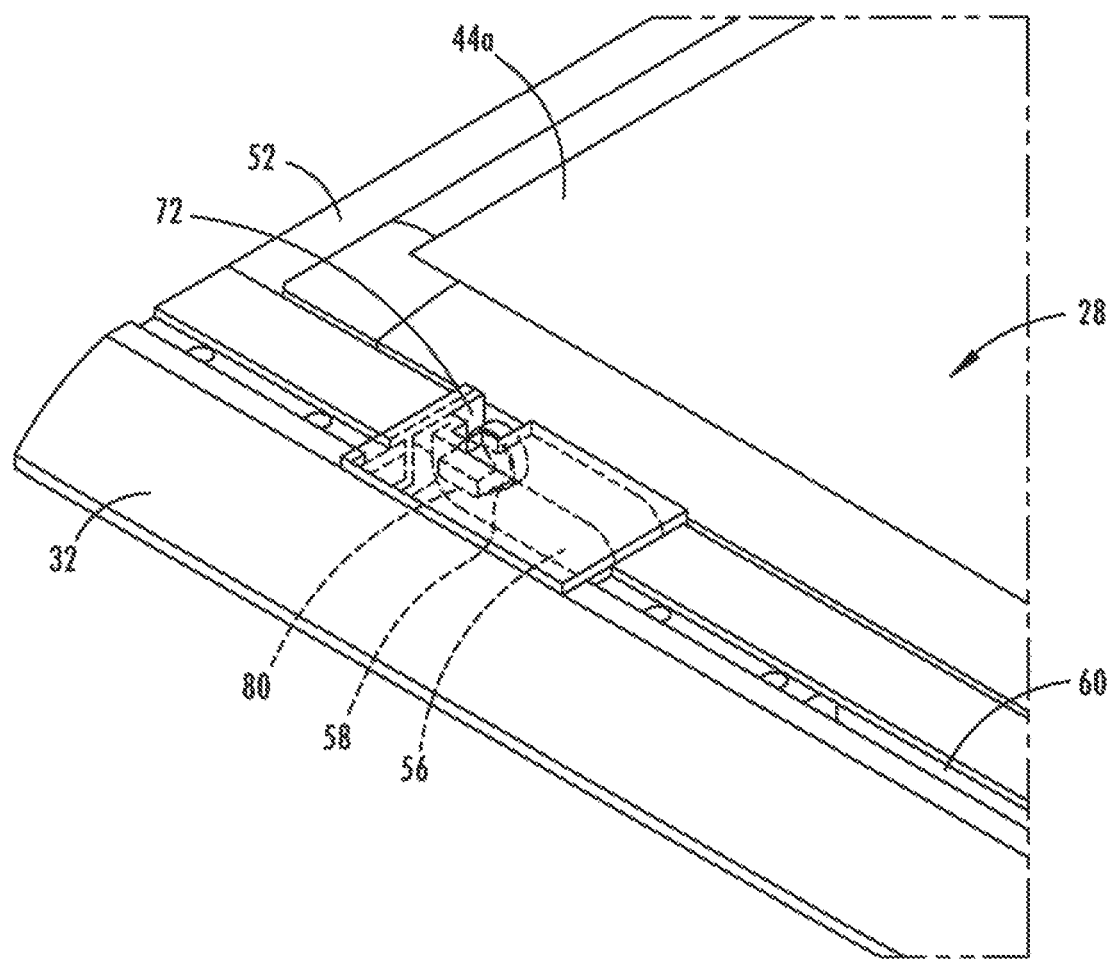
FIG. 7 shows the orientation of the pin of FIG. 5 relative to the slot of FIG. 4 when the tonneau cover is in an expanded state covering the cargo box of the pickup truck.

FIG. 7 shows the tonneau section 44a oriented horizontally after insertion of the pins 58 through the notched top opening 72 into the pin slots 56 of the side rails 32. As will be understood, upward lifting of the tonneau section 44a is prohibited by abutting of the flat protrusion 80 of the pin 58 against the notched top opening 72 of the pin slot 56, thereby securing the front of the tonneau section 44a to the side rail 32.

As will be appreciated, by reorienting the tonneau cover 28 such that tonneau section 44a is disposed vertically relative to the side rails 32, as shown in FIG. 6, when it is deployed on the pickup truck 24, the tonneau cover 28 can be removed from the pickup truck 24, thus providing full access to the cargo box. The tonneau cover 28 can then be stored elsewhere or in the cargo box until required again.

Figure 8:
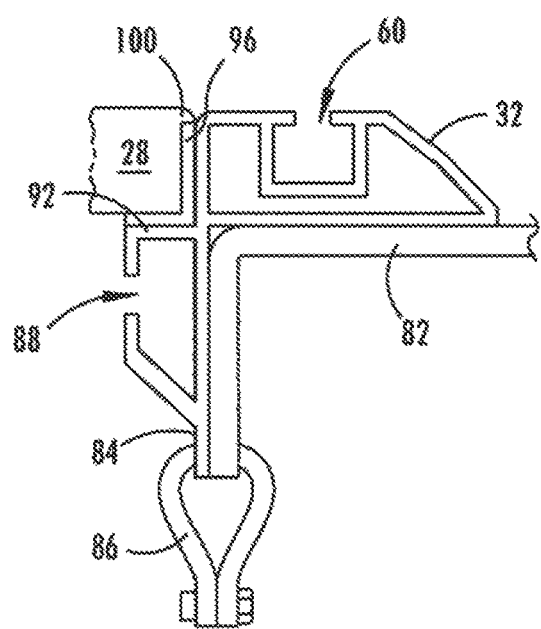
FIG. 8 shows a sectional view of the side rail at line A-A in FIG. 1.

FIG. 8 shows a cross section of the right side rail 32 atop a sidewall 82 of the cargo box of the pickup truck 24 at line A-A in FIG. 1. As shown, the side rail 32 has a utility track 60 along a top edge thereof. The side rail 32 is clamped along a vertical portion 84 thereof to the sidewall 82 of the pickup truck 24 by a clamp 86. A side utility track 88 is positioned along the vertical portion 84 to enable various attachments to be secured to the side rail 32 inside the cargo box for securing tools, tool boxes, and the like thereto. The attachments are generally additional components to be mounted inside the cargo box or to allow secondary mounting for accessories that require additional support like seating or items that will hold heavy cargo loads. Attachments may be securable to either or both of the side utility track 88 and the utility track 60 so that the utility tracks 60, 88 can accept independent accessories (one thing mounted to the top and a separate thing mounted to the inside) or one item that mounts in both slots simultaneously for additional support/rigidity. The inner utility track ends at the tonneau section 44a so that the tonneau cover can pass through to depend into the cargo bed without being obstructed by the inner utility track.

The side utility track 88 may be vented by one or more apertures along a rear and/or bottom surface thereof to permit water to drain from the inner utility track 88.

A tonneau rest 92 projects perpendicularly from the vertical portion 84 to provide a horizontal support for the tonneau cover 28. A sealing strip 96 is adhered to the upper part of the vertical portion 84 of the side rail and along the top surface of the tonneau rest 92 to provide a water-resistant seal and to dampen movement of the tonneau cover 28 during travel of the pickup truck 24. A flexible upper lip 100 of the tonneau cover 28 helps cover the gap between the tonneau cover 28 and the side rail 32.

Figure 9:
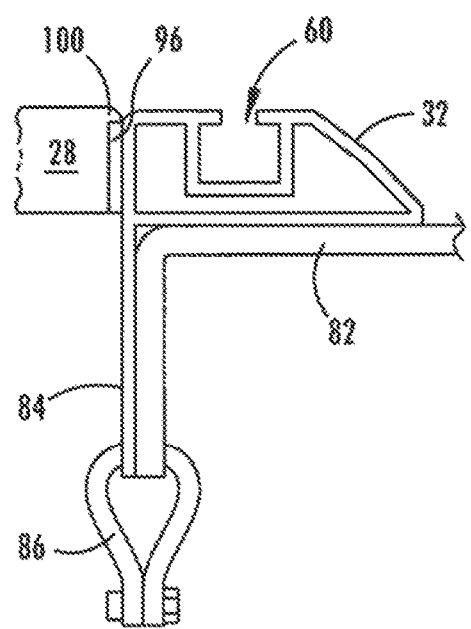
FIG. 9 shows a sectional view of the side rail at line B-B in FIG. 1.

FIG. 9 shows a cross section of the right side rail 32 atop of the sidewall 82 of the cargo box of the pickup truck 24 at line B-B in FIG. 1. As shown, the side utility track 88 and tonneau rest 92 continue from the back end of the side rail 32 until just before the back edge of the tonneau section 44*a* when the tonneau section 44 is oriented horizontally. The profile of the side rail 32 further front from that is as shown in FIG. 9. The tonneau cover 28 does not rest on a horizontal surface at the front end of the side rail 32.

Figure 10:
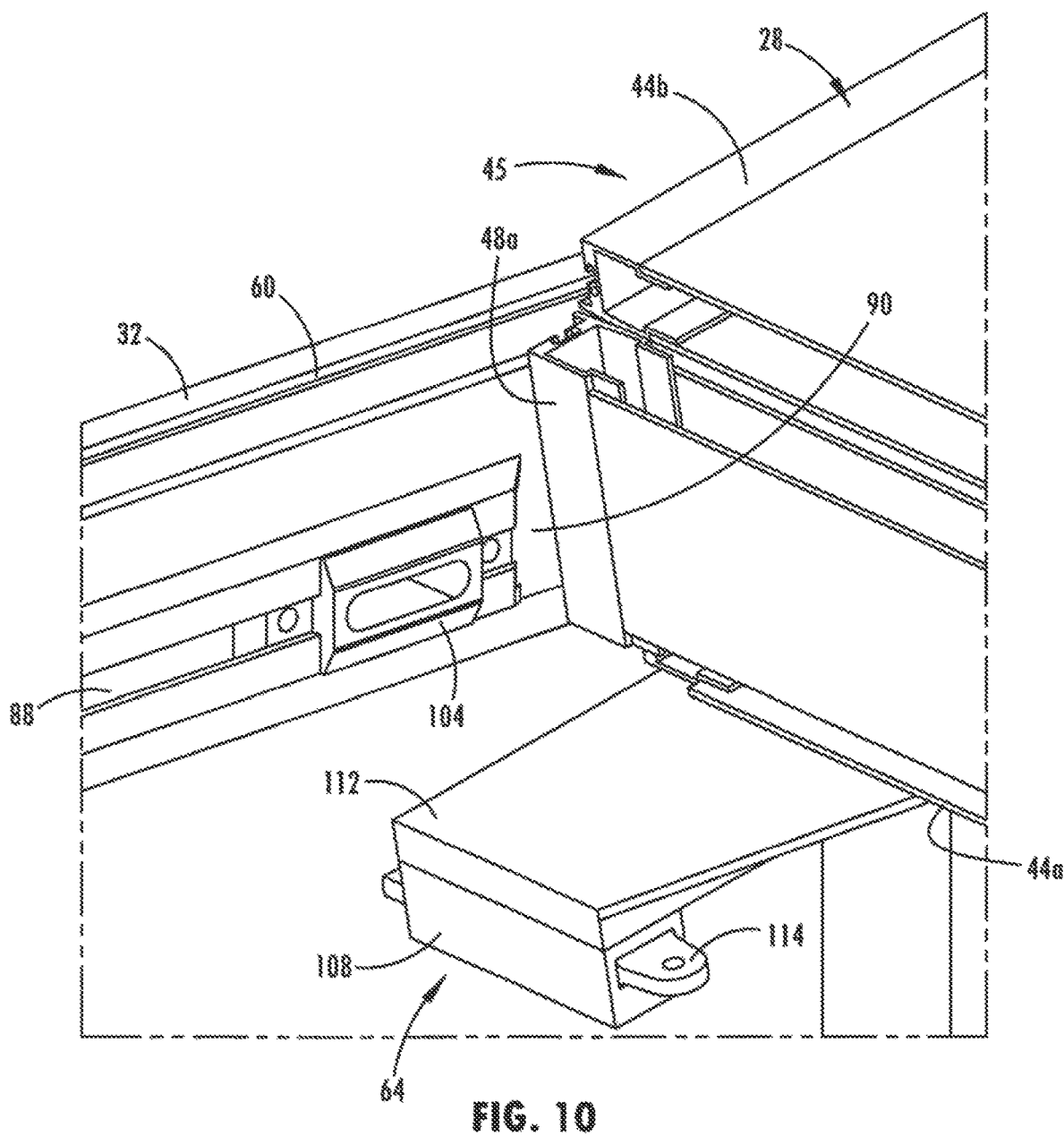
FIG. 10 shows a latch between a front-most tonneau section and the side rail of FIG. 2 in an open position as the stacked tonneau sections are being pivoted up out of the cargo box of the pickup truck.
Figure 11:
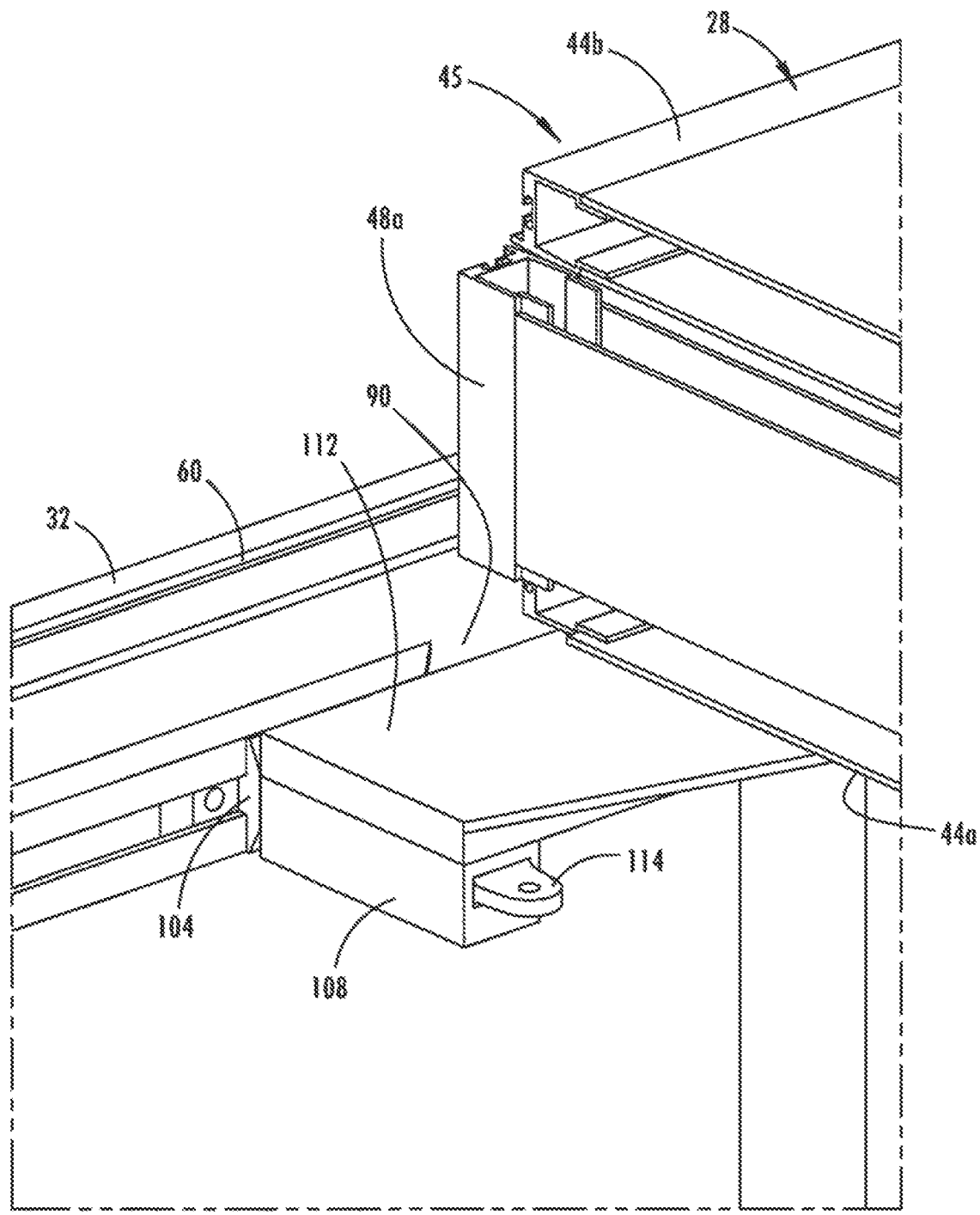
FIG. 11 shows the latch of FIG. 10 after engagement.

FIGS. 10 and 11 show the tonneau cover 28 being pivoted about the pin 58 in the pin slot 56 from a position in which the nested stacked tonneau cover 28 depends generally vertically into the cargo box to a generally horizontal position. To achieve the vertical orientation of the nested stacked tonneau cover, a latch and catch system may be used. Referring now to FIG. 10, the front latches 64 include a catch 104 secured to the side utility track 88 and a latchbolt 108 on a flange 112 extending from a rear bottom surface of the tonneau section 44*a*. The latchbolt 108 includes an actuator 114 to which a cable is fastened. The cable is then fastened to the actuator 114 of the corresponding latchbolt 108 on the other side of the tonneau section 44*a*. Pulling the cable releases the latchbolts 108 from the catches 104 to permit free pivotal movement of the nested stacked tonneau cover 28. The actuating of the actuator may be accomplished by hand or electrically.

As shown, the tonneau cover 28 has clearance 90 from the forward end of the inner side utility track 88 when nested and stacked to pivot about the pin 58 from a position in which it depends generally vertically in the cargo box to a position in which the tonneau cover 28 is generally horizontal and above the cargo box.

FIG. 11 shows the nested stacked tonneau cover 28 in a horizontal orientation with the front latch 64 engaged to restrict pivoting of the nested stacked tonneau cover 28.

FIG. 12 shows the horizontal position of the nested stacked tonneau cover 28 when the front latches 64 are engaged. The front latches 64 are sufficiently robust to support the weight of the tonneau cover 28 thereon.

Figure 13:
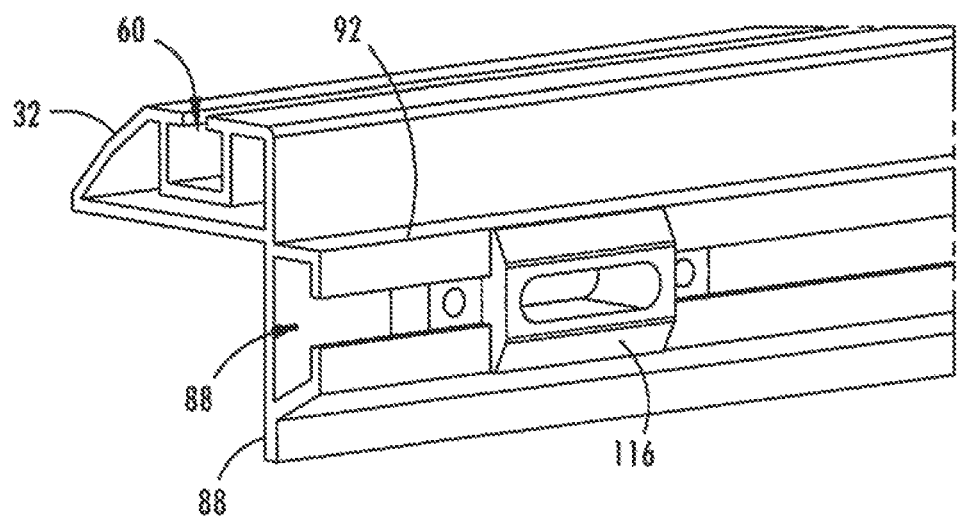
FIG. 13 shows an end view of a portion of a side rail and a catch of another latch for releasably securing the tonneau cover to the side rail of the frame.

FIG. 13 shows the rear end of the left side rail 32. A catch 116 of the rear latch 68 is shown secured to the side utility track 88.

Figure 14:
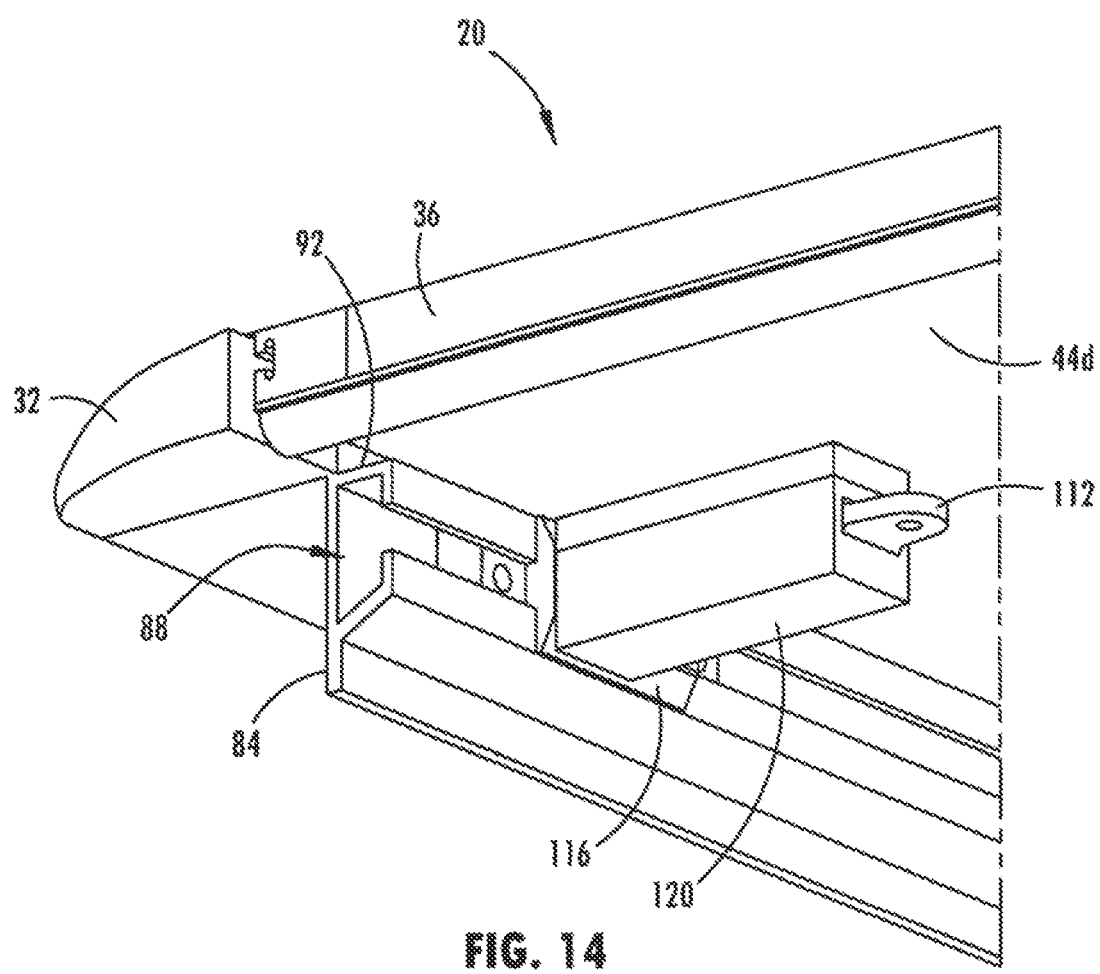
FIG. 14 shows a bottom perspective view of the latch of FIG. 13 after engagement.

FIG. 14 shows the underside of the tonneau cover 28 wherein a latchbolt 120 of the tonneau section 44*d* is engaged with the catch 116 to secure the tonneau cover 28 in a fully extended and horizontal position in which it covers the cargo box of the pickup truck 24. In this extended horizontal position, the rear three tonneau sections 44*b*, 44*c*, and 44*d* rest atop of the tonneau rests 92 of the side rails 32. Like the latchbolt 108, the latchbolt 120 includes an actuator 122 to which a cable is fastened. The cable is then fastened to the actuator 122 of the corresponding latchbolt 120 on the other side of the tonneau section 44*d*.

In order to put the tonneau cover 28 into the nested stacked horizontal position shown in FIG. 12, the cable between latchbolts 120 is pulled to release the latchbolts 120 from the catches 116. Once the rear latches 68 are released, the tonneau section 44*d* can be pivoted upward and forward about the hinge 50 into a stacked position atop of the tonneau section 44*c*. Stacked tonneau sections 44*c* and 44*d* can then be pivoted upward and forward about the second spacer member 48*b* into a stacked position atop of the tonneau section 48*b*. Similarly, nested stacked tonneau sections 44*b*, 44*c*, and 44*d* can be pivoted upward and forward about the first spacer member 48*a* into a stacked position atop of the tonneau section 48*a*, which is locked in a horizontal position via the front latches 64.

Figure 15:
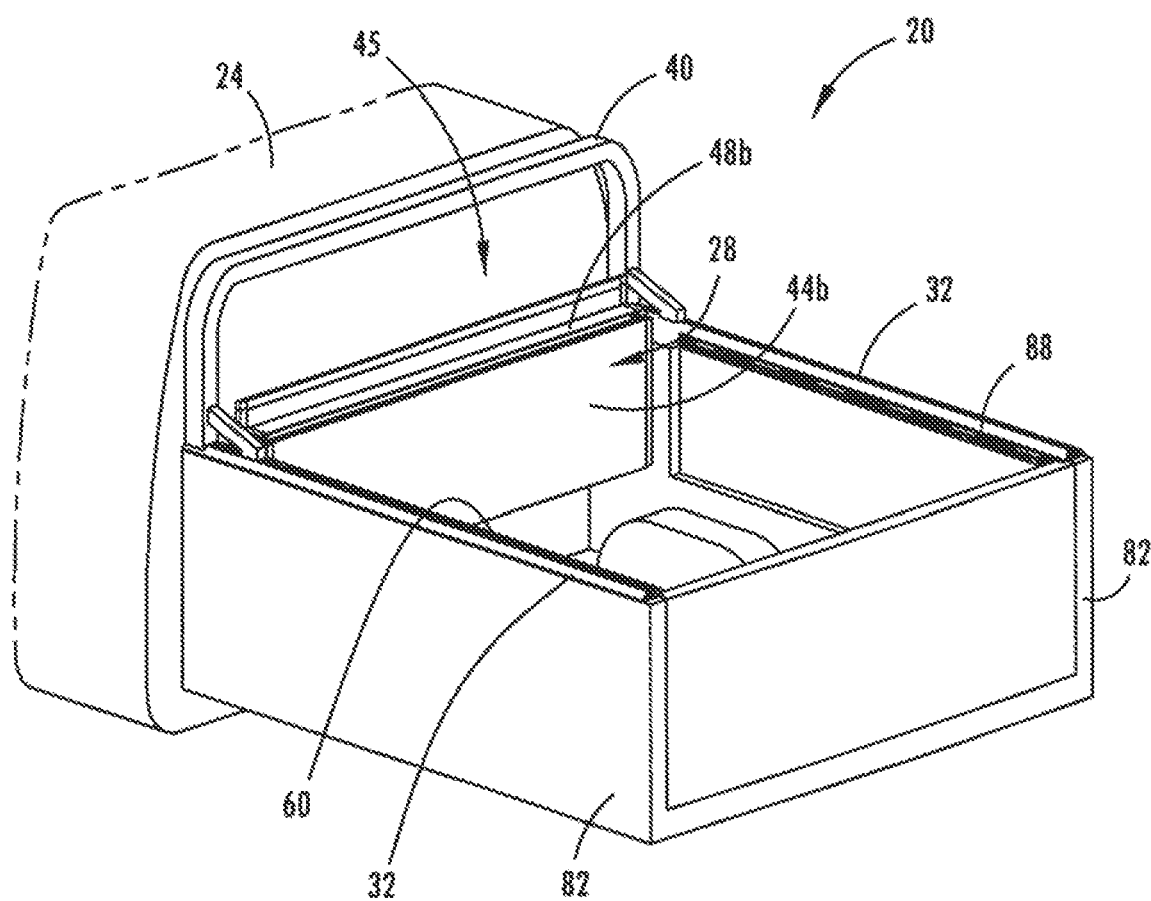
FIG. 15 shows the tonneau cover of FIG. 1 in a stacked state and depending into the cargo box of the pickup truck.

Releasing the front latches 64 allows the nested stacked tonneau cover 28 to be pivoted downward so that it depends into the cargo box, as shown in FIG. 15. As the pivot axis 59 of the pin 58 and pin slot 56 are close to the front edge of the cargo box, the nested stacked tonneau cover 28 tucks into the cargo box proximal to a front wall of the cargo box. Thus, in this manner, the tonneau cover 28 can be first stacked in a nested manner above the cargo box in a first position and then pivoted into the cargo box in a second position at the front edge thereof, thereby requiring little clearance inside the cargo box proximal to the front edge thereof. When the nested stacked tonneau cover 28 is pivoted down into the cargo box, it only occupies about a foot of cargo room at the front of the cargo box.

Figure 16:
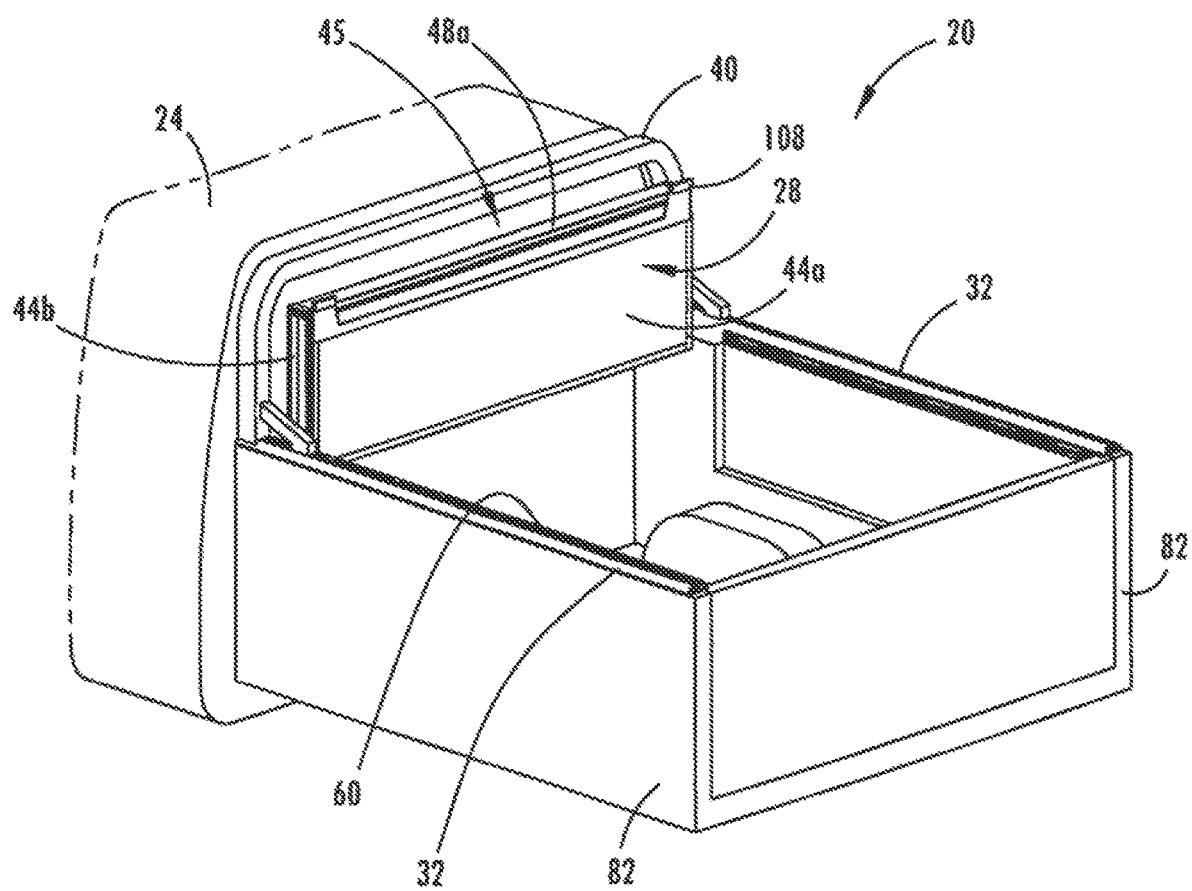
FIG. 16 shows the tonneau cover of FIG. 1 in a stacked state and oriented vertically above the cargo box of the pickup truck.

Alternatively, when the front latch 64 is released, the nested stacked tonneau cover 28 can be pivoted upwards and forwards to provide access to the cargo box, as shown in FIG. 16.

Figure 17:
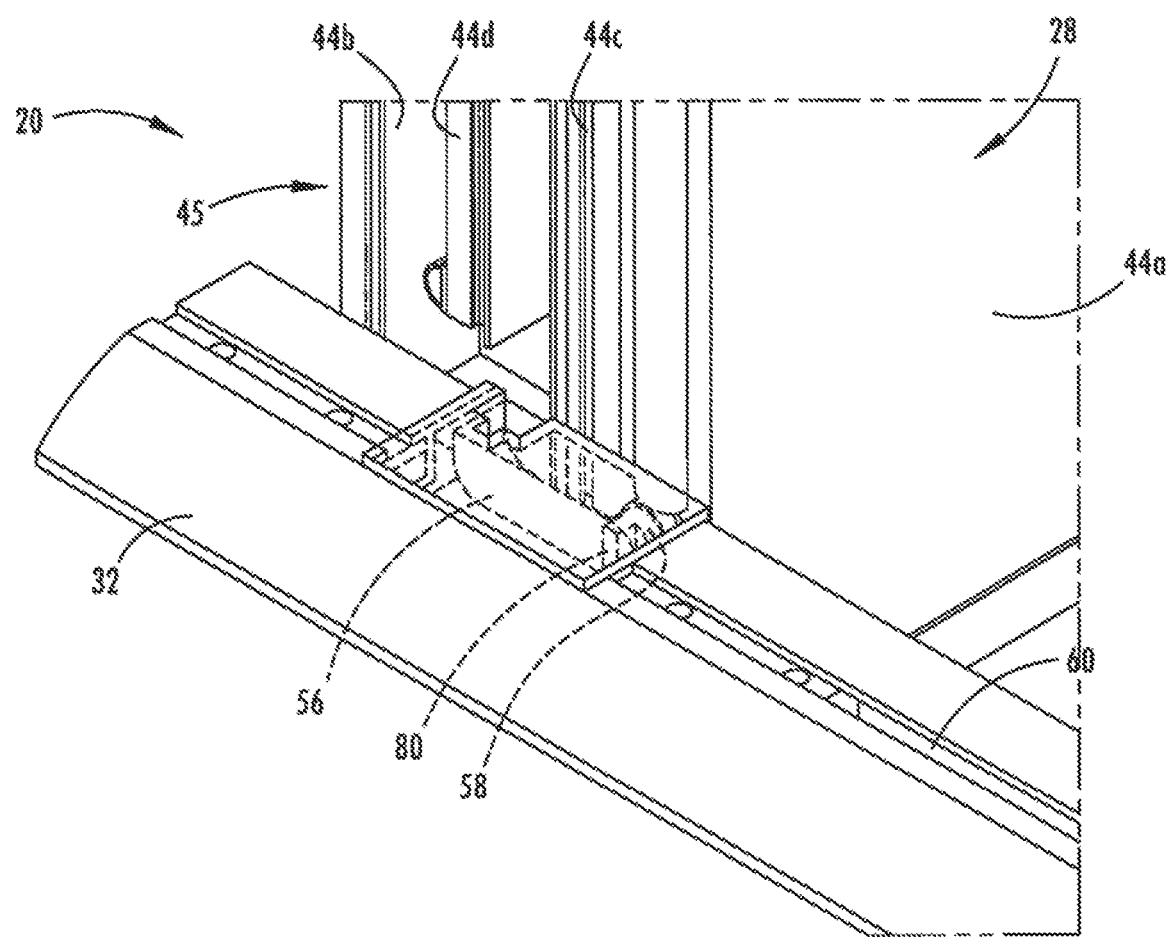
FIG. 17 shows the position and orientation of the pin of the tonneau cover inside the slot of FIG. 4 when the tonneau cover is stacked and oriented vertically as shown in FIG. 16.

FIG. 17 shows the position and orientation of the pin 58 of the tonneau section 44*a* relative to the pin slot 56 when the nested stacked tonneau cover 28 pivoted vertically upwards above the cargo box.

Figure 18:
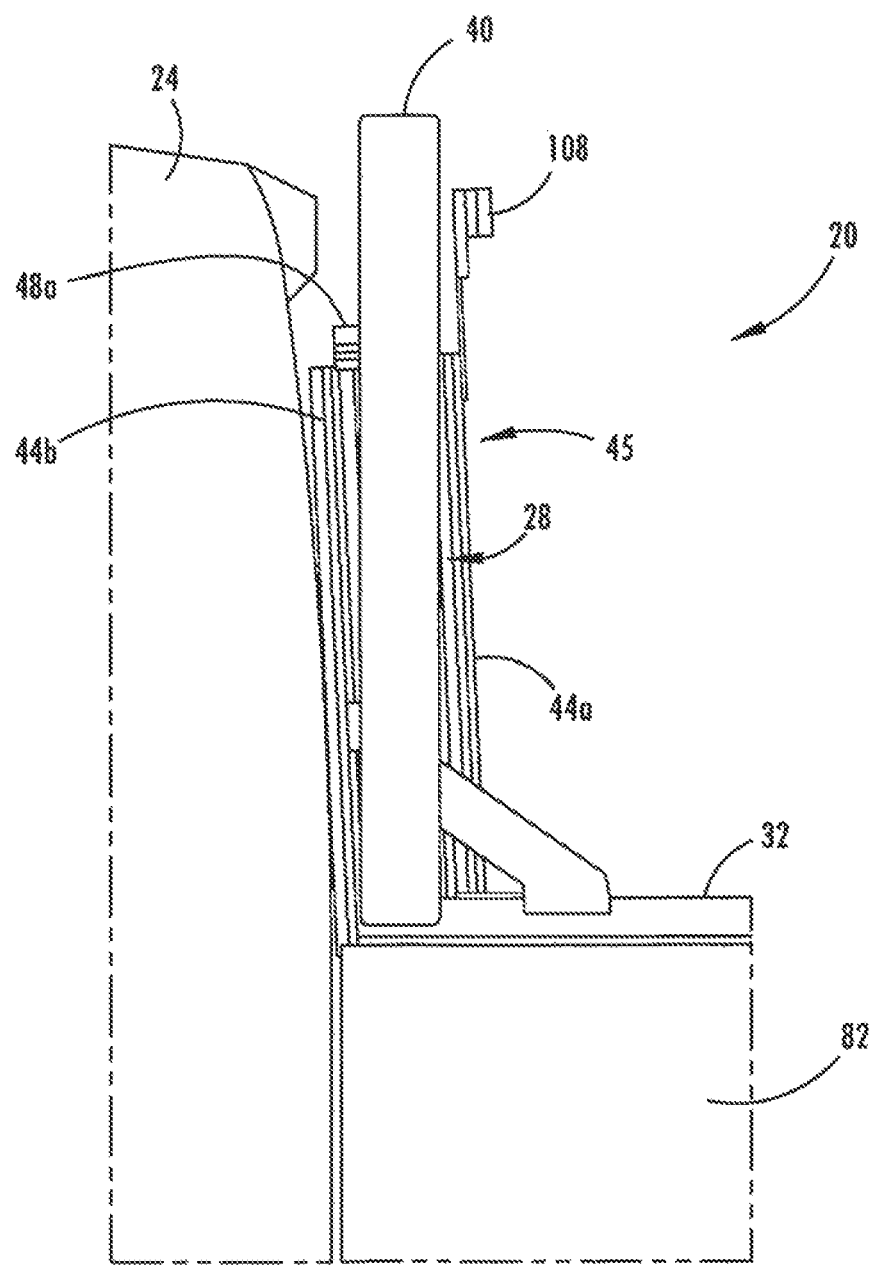
FIG. 18 shows a side view of the stacked tonneau cover oriented vertically out of the cargo box of FIG. 17.

FIG. 18 shows a side view of the nested stacked tonneau cover 28 when oriented vertically above the cargo box. As shown, the nested stacked tonneau cover 28 nests inside the utility rack 40 in this position.

Figure 19:
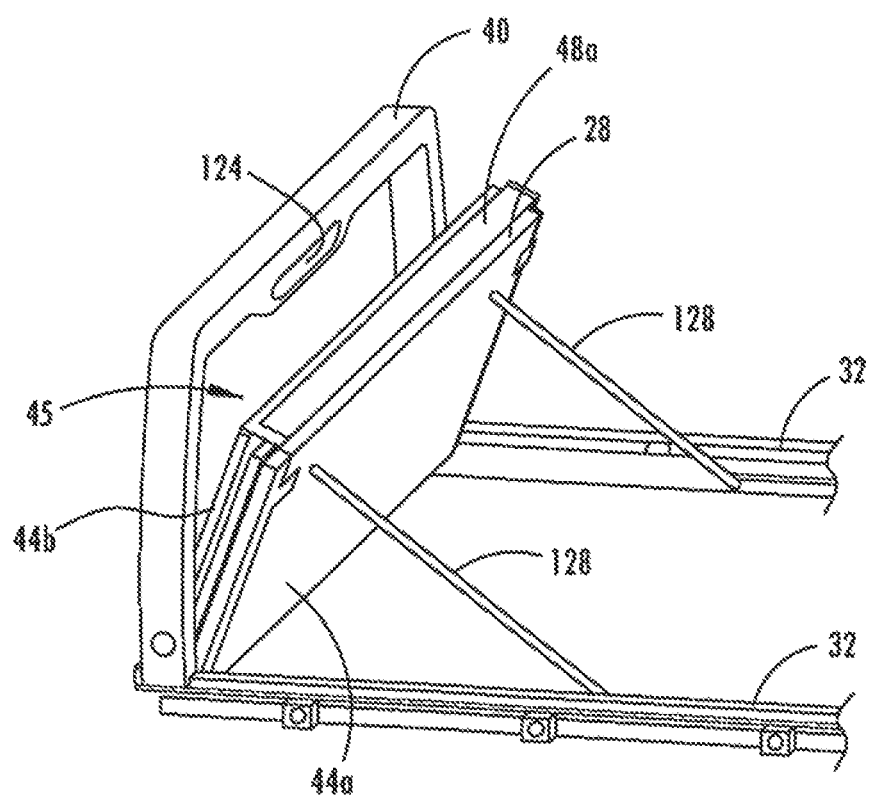
FIG. 19 shows the stacked tonneau cover being propped above the cargo box via a pair of struts.

FIG. 19 shows a pair of struts 128 pivotally connected to the bottom surface of the tonneau section 44*a* that can be snap connected to locations along the side rails 32 to maintain the nested stacked tonneau cover 28 in a generally upright position above the cargo box to provide access to cargo stored at the front end of the cargo box. When no longer required, the struts 128 are unsnapped from the side rails 32 so that the nested stacked tonneau cover 28 is free to pivot. In another embodiment, as shown in FIG. 28, a dead panel 702 in fixed relationship to the rails has one or more locking hinges 704 that are activated by cables 706, that allow the cover 28 to rotate upwards or downwards and locking at various angles, e.g., in 45 degree increments.

While in the above-described embodiment, the tonneau sections are primarily made of an aluminum shell housing a honeycomb structure, it can be desirable to modify their structure in certain scenarios.

Figure 20:
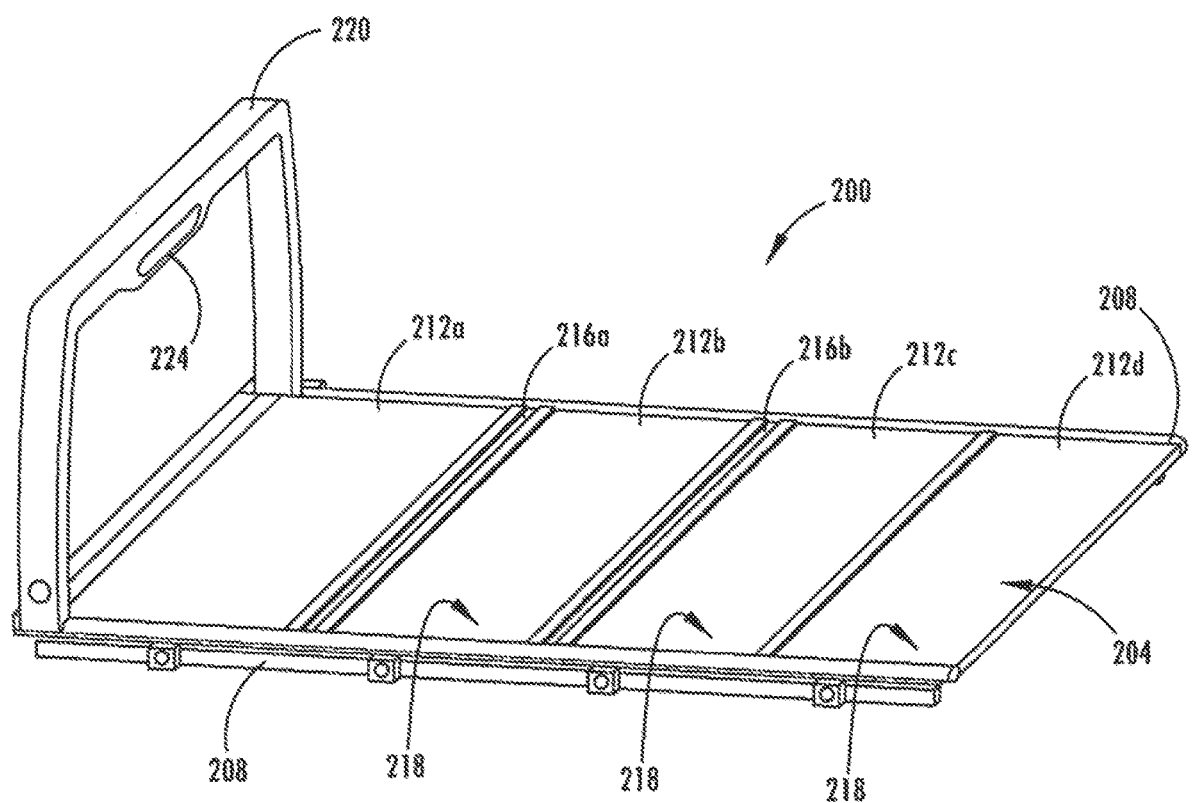
FIG. 20 shows a tonneau system similar to that of FIG. 1, wherein solar panels are positioned at the top surfaces of the tonneau cover sections.

FIG. 20 shows a tonneau system 200 in accordance with another embodiment that is similar to the previously described embodiment and illustrated in FIGS. 1 to 19, wherein solar panels 218 are installed on the top surface of a tonneau cover 204. Preferably the panels 218 are fastened, for example with screws or bolts and nuts, to be easily removable for service, repair, or upgrades. For example, solar panels can be interchanged with metal panels to add or remove solar function. The tonneau cover 204 rests between a pair of side rails 208. Like the tonneau cover 28 shown in FIG. 1, the tonneau cover 204 includes four tonneau sections 212*a*, 212*b*, 212*c*, and 212*d*. The tonneau sections 212*a*, 212*b*, 212*c*, and 212*d* have hinge systems there between to pivotally couple them. The hinge systems are piano hinges and spacer members 216*a* and 216*b* are used to enable nested stacking of the tonneau sections 212*a*, 212*b*, 212*c*, and 212*d* one atop another. In particular, a first spacer member 216*a* pivotally couples the tonneau section 212*a* that is closest to the front of the cargo box when deployed and the adjacent tonneau section 212*b* via piano hinges. A second spacer member 216*b* pivotally couples the tonneau section 212*b* to the adjacent tonneau section 212*c* via piano hinges. The tonneau section 212c is pivotally coupled to the rear-most tonneau section 212d via a piano hinge.

The tonneau section 212a and the spacer members 216a and 216b are constructed from aluminum panels housing a honeycomb structure therein to provide rigidity. The tonneau sections 212b, 212c, and 212d are constructed having solar panels 218 along their top surfaces.

A utility rack 220 has a brake light aperture 224 along a top bar thereof to enable visibility of the brake light at the top of the rear of the cabin when the tonneau system 200 is deployed thereon.

In order to transfer power generated from each solar panel 218 in tonneau sections 212b, 212c, and 212d, the solar panels 218 are coupled to a battery that stores the power.

Figure 21:
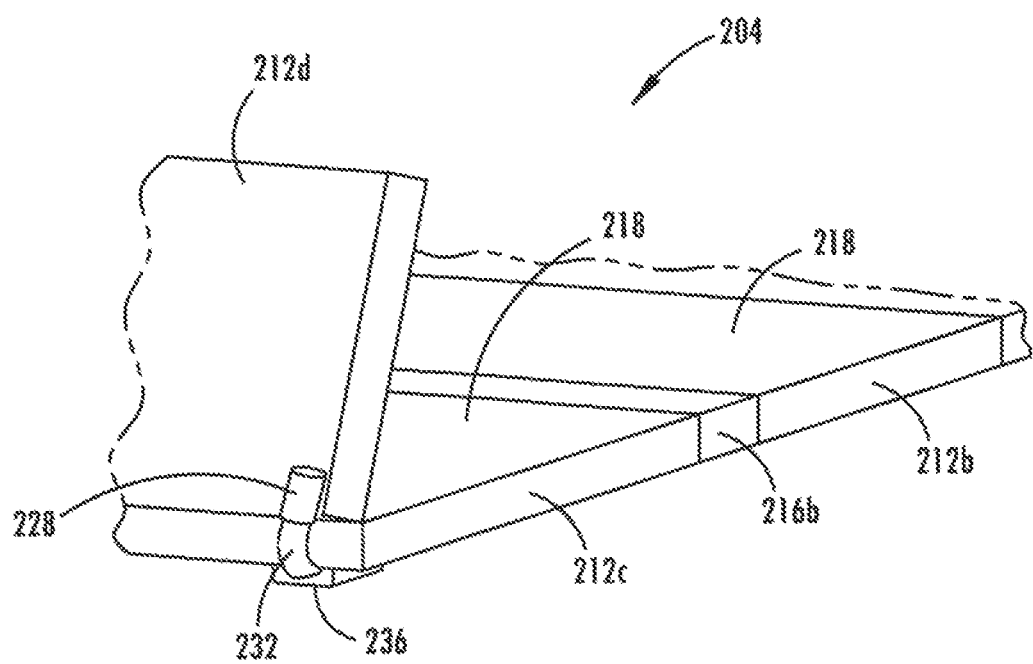
FIG. 21 shows an electrical coupling system for the tonneau cover sections of FIG. 20.

FIG. 21 shows the electrical cabling system employed with the tonneau cover 204. A plug 228 on the bottom of tonneau section 212d adjacent the front edge thereof receives a cable 232 that extends from a sheath 236 on the bottom surface of the tonneau section 212c adjacent a rear edge thereof. The cable 232 is rigid enough to resist bunching and pinching between the tonneau sections 212c, 212d when they abut one another in an expanded state. The sheath 236 extends into the tonneau section 212c and is sufficiently long enough to permit compression of the cable 232 therein when the tonneau section 212d is stacked atop of the tonneau section 212c. The cable 232 can be unplugged from the plug 228 to permit disassembly of the tonneau cover 204, for example, to replace a tonneau section having a faulty solar panel. Such cabling and connections are employed between tonneau sections 212a, 212b, 212c, and 212d and spacer members 216a and 216b. As will be understood, the slack length of the cable 232 between tonneau sections 212c, 212b, 212a and spacer members 216b, 216a is not as great as between the tonneau section 212c and the tonneau section 212d.

Each solar panel 218 may require its own cable to the battery. As a result, there may be two cables 232 between the tonneau section 212c and the tonneau section 212b, and three cables 232 between the tonneau section 212b and the tonneau section 212a.

Figure 22:
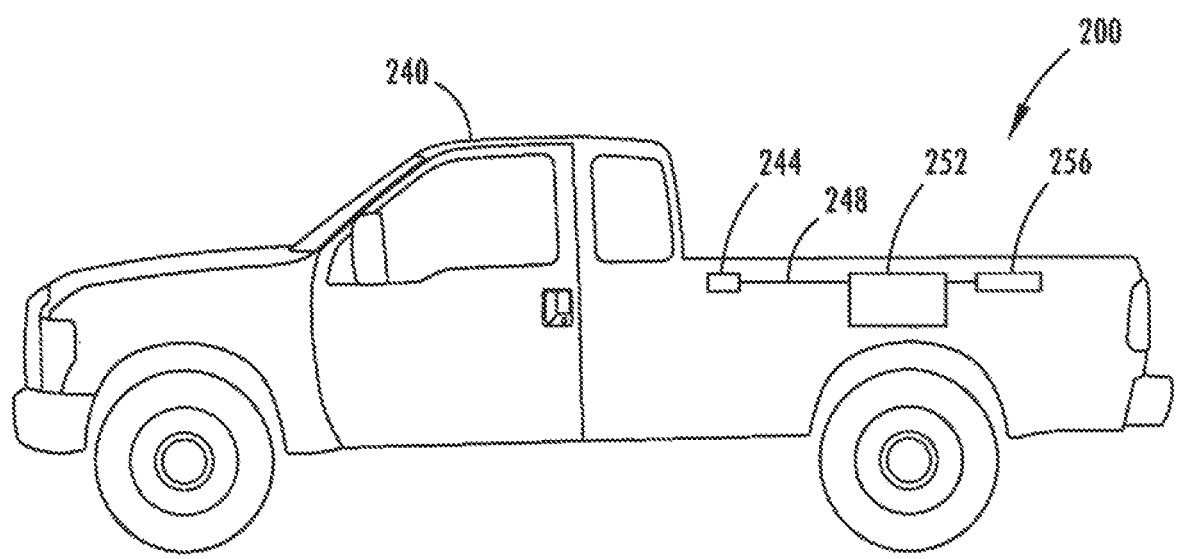
FIG. 22 shows a schematic view of the power collection and conversion system of the tonneau system of FIG. 20.

FIG. 22 is a schematic diagram of the power elements of the tonneau system 200 relative to a pickup truck 240 in which it is deployed. An inlet plug 244 can receive three cables from the tonneau section 212a. The cables are sufficiently long to permit pivoting of the tonneau cover 204 when stacked in a nested manner. The inlet plug 244 has a cable 248 extending back between the side rail 208 and the sidewall of the cargo box of the pickup truck 240. The cable 248 extends to a battery 252 in a retaining basket secured to a side utility track of the side rail 208. The battery 252 receives the power generated by the solar panels 218 and stores it. A transformer outlet 256 is coupled to the battery 252 for drawing power therefrom, converting it to alternating current, and powering a set of power outlets, such as a standard 220 volt household outlet, a USB port, etc. In this way, tools can be charged using solar power when they are not being used and when the tonneau cover 204 is extended to cover the cargo box of the pickup truck 240.

Figure 23:
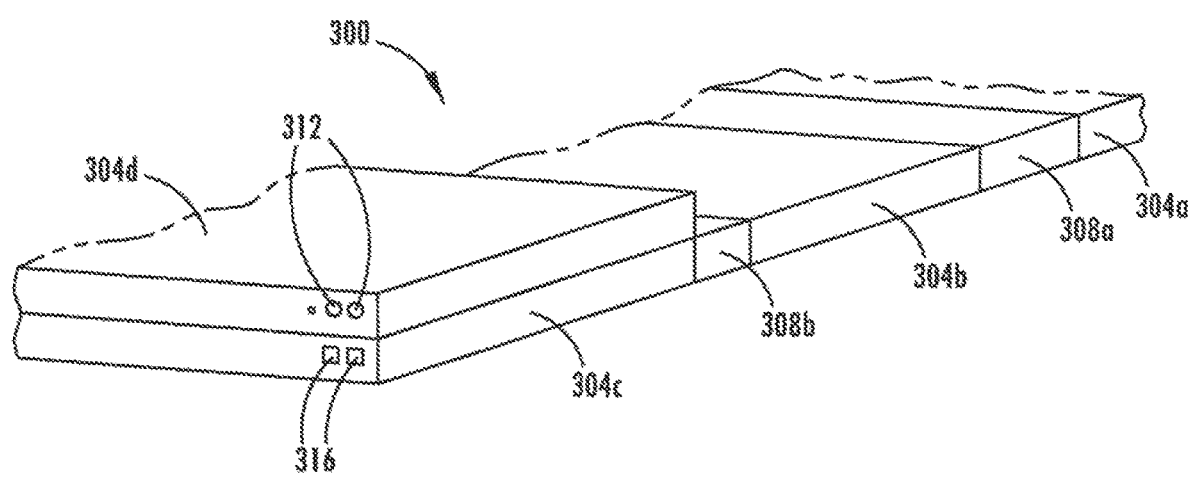
FIG. 23 shows an electrical coupling system for the tonneau cover sections of FIG. 20 in an alternative embodiment.

FIG. 23 shows a variation of the tonneau system of FIG. 20, wherein, a tonneau cover 300 does not employ external cabling between tonneau sections 304a, 304b, 304c, and 304d. Instead, a set of spring-loaded pins 312 along a front edge of each tonneau section 304 or spacer member 308 are urged towards a set of contacts 316 along a rear edge of an adjacent tonneau section 304 or spacer member 308. The number of sets of spring-loaded pins 312 and contacts 316 is increased from one set between the tonneau section 304d and the tonneau section 304c to two sets between the tonneau section 304c, the spacer member 308b, and the tonneau section 304b, to three sets between the tonneau section 304b, the spacer member 308a, and the tonneau section 304a. Further, such sets of spring-loaded pins 312 and contacts 316 can be employed between the tonneau section 304a and a front cross-member of a frame. Use of such spring-loaded pins and contacts avoids issues with the physical wearing of external cables that are articulated regularly.

Figure 24:
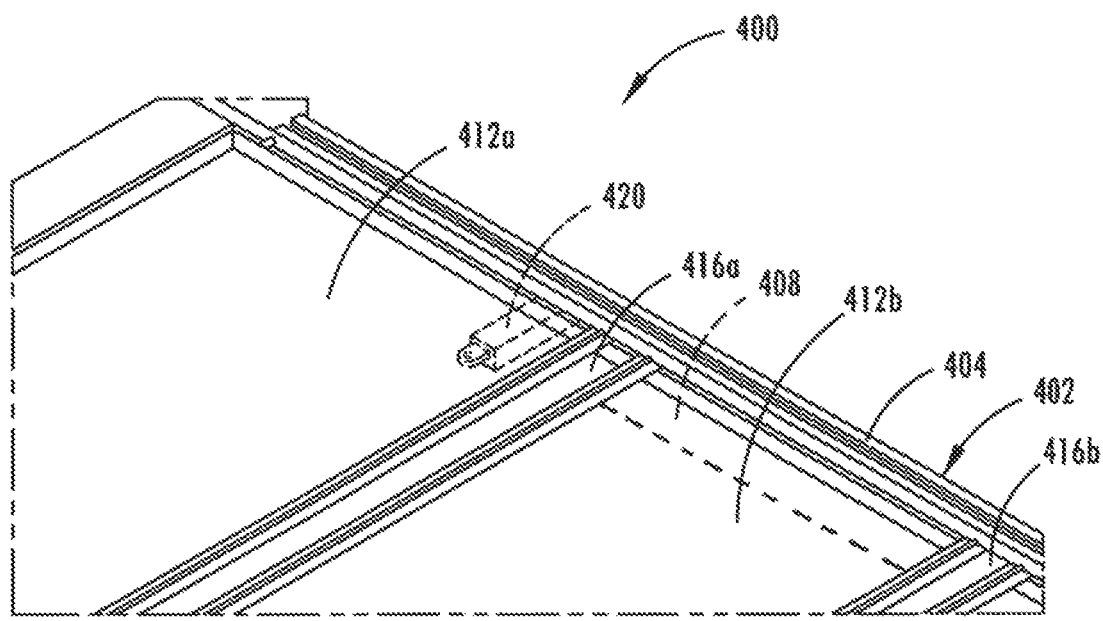
FIG. 24 shows a tonneau system in accordance with another embodiment, wherein the front latch is further forward than that of FIG. 1.

FIG. 24 shows an alternative configuration of a tonneau system 400. A frame 402 of the tonneau system 400 has two side rails 404 that include tonneau rests 408. A tonneau cover has tonneau sections 412a, 412b, 412c, and 412d, and spacer members 416a and 416b, similar to the configuration of the tonneau cover 28 of FIG. 1. A front latch 420 is shown under the tonneau section 412a forwards from its rear edge. The front latch 420 has a catch that is machined into the inside surface of the side rail 404. The tonneau rests 408 of the side rails 404 extend forward to about the rear edge of a spacer member 416a to permit the tonneau cover to pivot upwards or downwards unimpededly.

Figure 25:
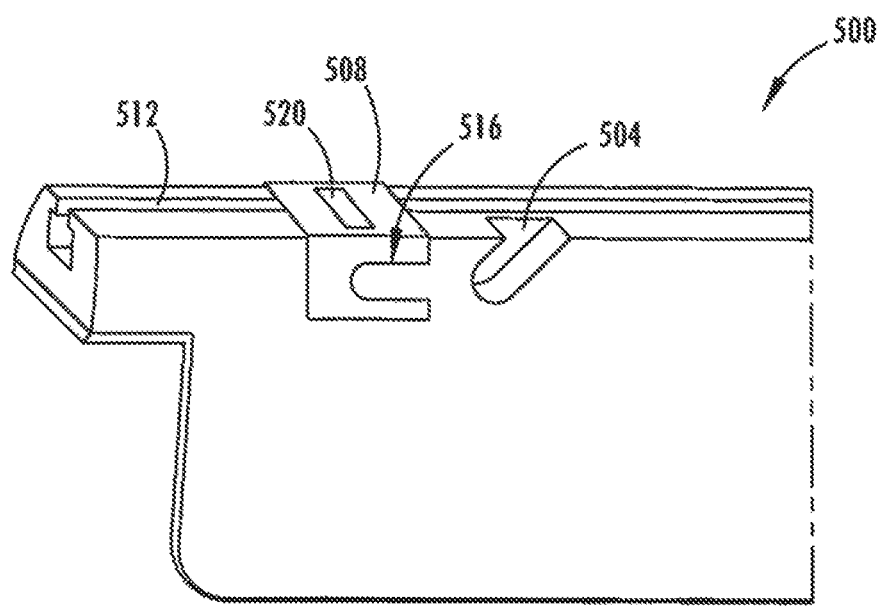
FIG. 25 shows a side rail for a tonneau system wherein the slot is diagonally sloped forward and down.

FIG. 25 shows a side rail 500 for use with a tonneau cover, the side rail 500 having a slot 504 that is angled forward and downward. While a tonneau cover will generally remain securely therein when latched in place, a locking bracket 508 for securing a pin of the tonneau cover in place in the slot 504 is secured in a utility track 512 along the top of the side rail 500. The locking bracket 508 can be biased between an open position, as shown, and a locking position, in which a locking slot 516 on a front edge of the locking bracket 508 can engage and secure the pin of the tonneau cover, via a ridge 520. The locking bracket 508 is secured in the open and locking positions via a protuberance on the inside of the locking bracket and indentations on the side rail 500. Removal of the tonneau cover is facilitated with the slot 504 as it can be pulled up and backward out of the slot 504 once the locking bracket 508 is moved to the shown open position.

Figure 26:
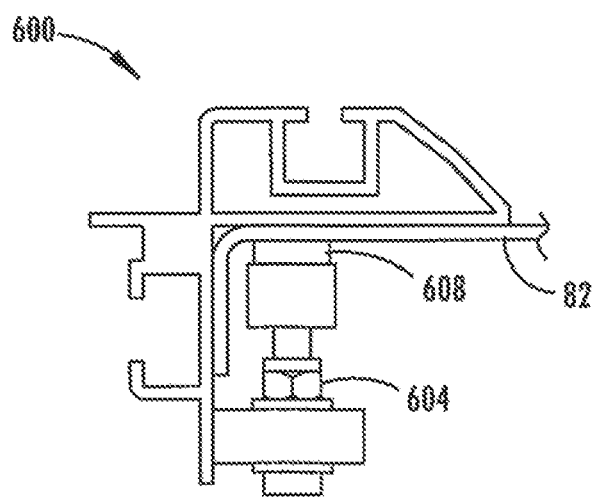
FIG. 26 is a sectional view of a side rail similar to that of FIG. 8 in accordance with another embodiment, wherein the side rail is clamped to a horizontal portion of the side wall of the cargo box.

FIG. 26 shows a side rail 600 similar to that of FIG. 8 in accordance with another embodiment, wherein the side rail 600 has a clamping element 604 that clamps a horizontal portion of the side wall 82 of the cargo box. A rubber end 608 of the clamping element 604 is provided to reduce damage to the surface of the side wall 82 of the cargo box.

While certain configurations for the slot have been shown, those skilled in the art will appreciate that slots having other paths other than those shown can also be utilized. Preferably, the front of the tonneau cover cannot be lifted directly out of the slot when it is latched in, such as with a substantially vertical slot, unless additional securing means are employed to impede removal from the slot.

While the power elements connected to the solar panels have been described as separate from the main electrical systems of a pickup truck, those skilled in the art will appreciate that it may be advantageous to couple the solar panels electrically to the main battery of a pickup truck, especially in cases where the pickup truck is a hybrid or electrically-powered vehicle.

The tonneau sections may be made so as to receive either solar panels or non-solar panels, allowing customization after purchase and replacement of a solar panel unit if faulty. Access to the panels can be provided via a removable panel fastened to the underside of the tonneau sections via screws, etc. The tonneau sections can provide a frame into which the solar panels or non-solar panels can be fitted.

While the tonneau sections have been described as rigid above, those skilled in the art will appreciate that the main panels of the tonneau sections, where not using solar panels, can be either rigid or flexible. Rigid panels for the tonneau sections can be constructed from, for example, fiberglass, plastic, or metal. Alternatively, the panels can be flexible and secured over a rigid frame.

Flexible panels for the tonneau sections can be made from any weather-resistant flexible material that is also resistant to wear, such as vinyl coated tarpaulin.

Instead of using tonneau rests along the side rails of the cargo box extending backward behind the first tonneau section, each of the other tonneau sections can also be held in a horizontal cover position via a locking mechanism such as the slam latches described above, etc.

Figure 27:
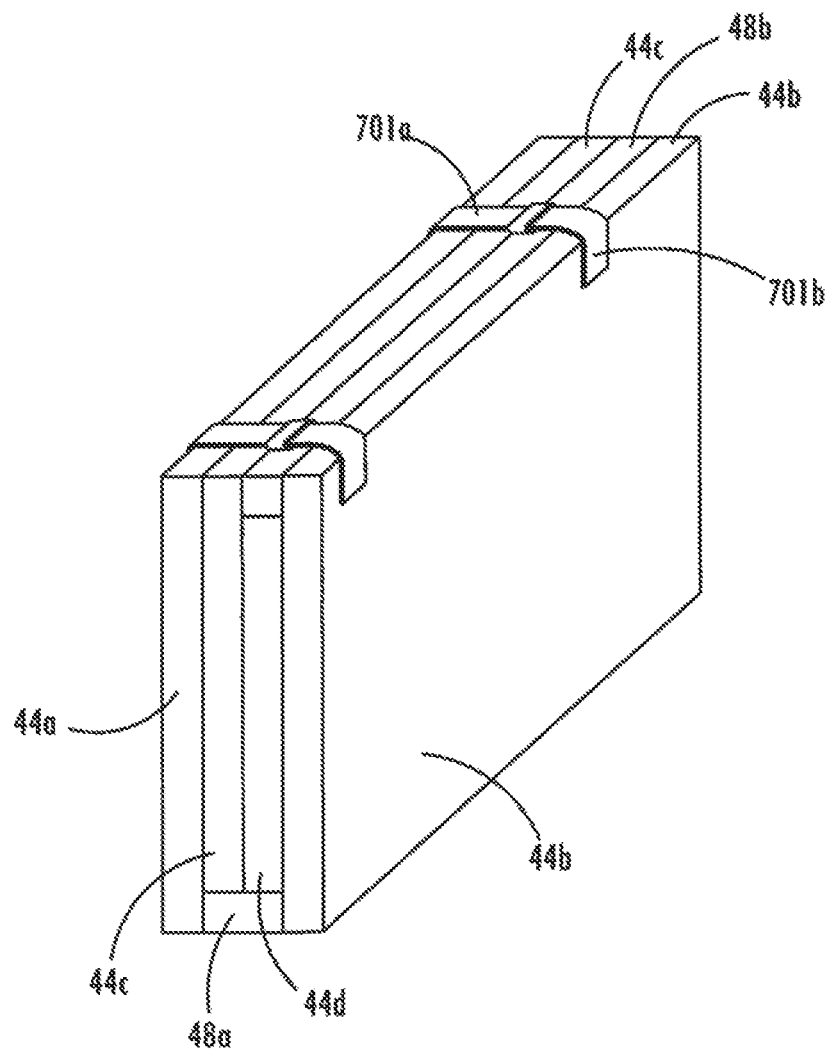
FIG. 27 shows an exemplary fastener for maintaining the tonneau system in a nested stacked arrangement.

As shown in FIG. 27, a retaining mechanism, such as a buckle or plurality of buckles, may be provided to maintain the sections in stacked orientation. The buckle 700 may comprise two portions, one 701a of which is secured to the first tonneau section 44a and the other 701b to either spacer 48b or the second tonneau section 44b so that closing the buckle 700 retains the third tonneau section 44c and fourth tonneau section 44d nested within an envelope created by the first tonneau section 44a, spacer 48a, second tonneau section 44b and spacer 48b.

Although the invention has been described with reference to certain specific embodiments, various modifications thereof will be apparent to those skilled in the art. The scope of the claims should not be limited by the preferred embodiments, but should be given the broadest interpretation consistent with the description as a whole.

We claim:

1. A solar-integrated tonneau system for use with a cargo box of a pickup truck, the tonneau system comprising:
    a tonneau cover comprising a plurality of tonneau sections including at least a first tonneau section and a second tonneau section;
    a hinge system positioned between the first tonneau section and the second tonneau section and configured to permit pivoting of the first tonneau section and the second tonneau section relative to each other;
    a solar energy-receiving material disposed on or along a top exposed surface of the first tonneau section and the second tonneau section, thus forming a top exposed surface of at least a portion of the tonneau system, wherein the solar energy-receiving material of the first tonneau section is electrically coupled to the solar energy-receiving material of the second tonneau section.

2. The tonneau system according to claim 1, wherein the solar energy-receiving material is a solar panel.

3. The tonneau system according to claim 1, wherein the plurality of tonneau sections are moveable between an unfolded position and a folded position, wherein in the unfolded position the tonneau sections are configured to substantially cover the cargo box and in the folded position, the tonneau sections are configured to be arranged in a nested stack.

4. The tonneau system according to claim 3, wherein the solar energy-receiving material substantially covers each corresponding tonneau section and moves with the corresponding tonneau section between the unfolded position and the folded position.

5. The tonneau system according to claim 4, wherein the stack is pivotable about a pivot axis between a horizontal position and a vertical position above the cargo box.

6. The tonneau system according to claim 1, wherein the solar energy-receiving material substantially covers each corresponding tonneau section and moves with the corresponding tonneau section when pivoting about the hinge system.

7. The tonneau system according to claim 1, further comprising a frame to which the tonneau cover is secured, wherein the solar energy-receiving material is positioned between rails of the frame.

8. The tonneau system according to claim 1, wherein the plurality of tonneau sections comprises:
    a bulkhead section;
    at least one middle section pivotally connected at a front end to a tail end of the bulkhead section;
    a tailgate section pivotally connected at a front end to a tail end of the at least one middle section;
    a spacer disposed within a hinged connection between the bulkhead section and the at least one middle section,
    wherein the tailgate section is foldable onto the at least one middle section, and the tailgate section and the at least one middle section collectively are foldable onto the bulkhead section.

9. The tonneau cover system according to claim 1, wherein the first tonneau section is adjacent to the second tonneau section.

10. The tonneau cover system according to claim 1, wherein the solar energy-receiving material of the first tonneau section is directly electrically coupled to the solar energy-receiving material of the second tonneau section.

11. The tonneau system according to claim 1, wherein the tonneau sections are formed from aluminum.

12. The tonneau system according to claim 1, further comprising an energy storage system electrically coupled to the solar energy-receiving material for storing and deploying power generated by the solar energy-receiving material.

13. The tonneau system according to claim 12, further comprising a retaining basket for holding the energy storage system secure to a sidewall of the pickup truck.

14. The tonneau system according to claim 12, further comprising an electrical cabling system disposed along a bottom surface of the tonneau cover, the electrical cabling system electrically coupling the solar energy-receiving material to the energy storage system.

15. The tonneau system according to claim 14, wherein the electrical cabling system comprises a plurality of cables including a cable for electrically coupling the solar energy-receiving material to the energy storage system.

16. The tonneau cover system according to claim 12, wherein the solar energy-receiving material of at least one tonneau section is electrically coupled to the energy storage system through an electrical connection to an adjacent tonneau section.

17. The tonneau system according to claim 1, further comprising:
    a first side rail configured to be respectively mounted to a first sidewall of the cargo box; and
    a second side rail configured to be respectively mounted to a second sidewall of the cargo box,
    wherein in an expanded position, the tonneau cover is configured to be secured to the first and second side rails, such that the tonneau cover substantially covers the cargo box.

18. A solar-integrated tonneau system for use with a cargo box of a pickup truck, the tonneau system comprising:
    a tonneau cover comprising a plurality of tonneau sections including at least a first tonneau section and a second tonneau section;

a hinge system positioned between the first tonneau section and the second tonneau section and configured to permit pivoting of the first tonneau section and the second tonneau section relative to each other;

a solar energy-receiving material disposed on or along a top exposed surface of the first tonneau section and the second tonneau section, thus forming a top exposed surface of at least a portion of the tonneau system; and an energy storage system electrically coupled to the solar energy-receiving material for storing and deploying power generated by the solar energy-receiving material, wherein the solar energy-receiving material of one of the first or second tonneau section is electrically coupled to the energy storage system through an electrical connection to the other of the first or second tonneau section.

19. The tonneau system according to claim 18, further comprising an electrical cabling system disposed along a bottom surface of the tonneau cover, the electrical cabling system electrically coupling the solar energy-receiving material to the energy storage system.

\* \* \* \* \*